(12) United States Patent
Wishart et al.

(10) Patent No.: US 7,181,348 B2
(45) Date of Patent: Feb. 20, 2007

(54) AUTOMATIC IDENTIFICATION OF COMPOUNDS IN A SAMPLE MIXTURE BY MEANS OF NMR SPECTROSCOPY

(75) Inventors: David Scott Wishart, Edmonton (CA); Russell Greiner, Edmonton (CA); Tim Alan Rosborough, Edmonton (CA); Brent Allen Lefebvre, Edmonton (CA); Noah Alexander Epstein, Edmonton (CA); Jack Barless Newton, Edmonton (CA); Warren Roger Wong, Edmonton (CA)

(73) Assignee: Chenomx, Inc., Edmonton (CA)

( * ) Notice: Subject to any disclaimer, the term of this patent is extended or adjusted under 35 U.S.C. 154(b) by 0 days.

(21) Appl. No.: 10/615,342
(22) Filed: Jul. 7, 2003

(65) Prior Publication Data

US 2005/0075796 A1 Apr. 7, 2005

Related U.S. Application Data

(62) Division of application No. 10/416,988, filed as application No. PCT/CA01/01544 on Nov. 1, 2001.

(30) Foreign Application Priority Data

Jan. 15, 2001 (CA) .................................. 2331116

(51) Int. Cl.
*G01N 24/00* (2006.01)
(52) U.S. Cl. ............................ 702/22; 702/25; 702/30; 702/32; 436/173
(58) Field of Classification Search .................. 702/22, 702/19, 21, 27, 23–25, 30–32, 76, 77, 66, 702/71, 73, 189, 193; 700/266, 267; 436/71, 436/173, 63, 64, 43; 422/68.1, 62, 50; 600/419, 600/410, 411, 407; 128/922; 435/111; 324/309, 324/300, 307, 310, 312, 315; 250/339.12
See application file for complete search history.

(56) References Cited

U.S. PATENT DOCUMENTS 3,789,832 A 2/1974 Damadian ................... 600/410

(Continued)

FOREIGN PATENT DOCUMENTS

EP 0350546 1/1990

(Continued)

OTHER PUBLICATIONS

Iles "Clinical biofluids," *Encyclopedia of Analytical Science*; Nuclear Magnet Spectroscopy—Applications: 3532-3544 (1995), no month.

(Continued)

*Primary Examiner*—Hal Wachsman
(74) *Attorney, Agent, or Firm*—Townsend and Townsend and Crew LLP; Kenneth R. Allen

(57) ABSTRACT

A computer implemented process for producing a representation of a reference spectrum for a hypothetical solution having a first pH condition, for use in determining the composition of a test sample, is disclosed, The process involves producing a position value for at least one peak of the reference spectrum in response to a measured pH condition of the test sample and a property of at least one peak in a base reference spectrum for the hypothetical solution, the base reference spectrum being associated with a pH condition of the hypothetical solution that is different from the measured pH condition.

14 Claims, 24 Drawing Sheets

U.S. PATENT DOCUMENTS

| | | | |
|---|---|---|---|
| 4,081,742 A | 3/1978 | Hofer et al. | 324/307 |
| 4,390,633 A | 6/1983 | Merilan et al. | 436/65 |
| 4,728,889 A | 3/1988 | Gadian et al. | 324/307 |
| 4,851,780 A | 7/1989 | Dejon et al. | 324/322 |
| 4,912,050 A | 3/1990 | Fossel | 436/64 |
| 4,918,021 A | 4/1990 | Fossel | 436/64 |
| 4,933,844 A | 6/1990 | Otvos | 600/419 |
| 4,940,055 A | 7/1990 | Brown | 600/410 |
| 4,975,581 A | 12/1990 | Robinson et al. | 250/339.09 |
| 4,988,628 A | 1/1991 | Nanji | 436/173 |
| 5,015,954 A | 5/1991 | Dechene et al. | 324/302 |
| 5,041,789 A | 8/1991 | Keller et al. | 324/318 |
| 5,046,846 A | 9/1991 | Ray et al. | 356/326 |
| 5,055,389 A | 10/1991 | Bar-Or et al. | 435/4 |
| 5,072,732 A | 12/1991 | Rapoport et al. | 600/411 |
| 5,124,267 A | 6/1992 | Humpel et al. | 436/518 |
| 5,146,166 A | 9/1992 | Bartuska | 324/321 |
| 5,198,766 A | 3/1993 | Spraul et al. | 324/300 |
| 5,207,715 A | 5/1993 | Fossel | 600/410 |
| 5,213,101 A | 5/1993 | Fossel | 600/410 |
| 5,218,529 A * | 6/1993 | Meyer et al. | 702/28 |
| 5,220,302 A | 6/1993 | Nunnally et al. | 335/301 |
| 5,229,716 A | 7/1993 | Demoment et al. | 324/307 |
| 5,231,031 A | 7/1993 | Szwergold et al. | 436/63 |
| 5,247,175 A | 9/1993 | Schoen et al. | 250/281 |
| 5,258,712 A | 11/1993 | Hofmann et al. | 324/318 |
| 5,261,405 A | 11/1993 | Fossel | 600/410 |
| 5,283,036 A | 2/1994 | Hofmann et al. | 422/70 |
| 5,308,982 A | 5/1994 | Ivaldi et al. | 250/339.12 |
| 5,313,406 A | 5/1994 | Kauppinen et al. | 702/28 |
| 5,318,031 A | 6/1994 | Mountford et al. | 600/410 |
| 5,338,687 A | 8/1994 | Lee et al. | 436/173 |
| 5,343,389 A | 8/1994 | Otvos | 436/173 |
| 5,397,987 A | 3/1995 | Garritano | 324/307 |
| 5,397,989 A | 3/1995 | Spraul et al. | 324/321 |
| 5,446,681 A | 8/1995 | Gethner et al. | 702/27 |
| 5,470,750 A | 11/1995 | Bar-Or | 436/63 |
| 5,517,856 A | 5/1996 | Hofmann et al. | 324/321 |
| 5,559,038 A | 9/1996 | Kolhouse et al. | 436/86 |
| 5,617,861 A | 4/1997 | Ross et al. | 600/410 |
| 5,618,734 A | 4/1997 | Niwa et al. | 436/173 |
| 5,629,210 A | 5/1997 | Hercules et al. | 436/71 |
| 5,668,373 A | 9/1997 | Robbat, Jr. et al. | 230/339.12 |
| 5,685,300 A | 11/1997 | Kuenstner | 600/366 |
| 5,707,875 A * | 1/1998 | Tamura et al. | 436/173 |
| 5,710,713 A | 1/1998 | Wright et al. | 702/23 |
| 5,726,570 A | 3/1998 | Spraul et al. | 324/321 |
| 5,822,219 A | 10/1998 | Chen et al. | 702/27 |
| 5,878,746 A | 3/1999 | Lemelson et al. | 600/407 |
| 5,887,588 A | 3/1999 | Usenius et al. | 600/410 |
| 5,926,773 A | 7/1999 | Wagner | 702/22 |
| 6,035,246 A | 3/2000 | Wagner | 700/266 |
| 6,063,026 A | 5/2000 | Schauss et al. | 600/30 |
| 6,617,167 B2 * | 9/2003 | Otvos et al. | 436/71 |
| 6,696,838 B2 * | 2/2004 | Raftery et al. | 324/321 |
| 2002/0145425 A1 | 10/2002 | Ebbels et al. | 324/309 |
| 2003/0023386 A1 | 1/2003 | Aranibar et al. | 202/19 |

FOREIGN PATENT DOCUMENTS

| | | |
|---|---|---|
| WO | WO91/10128 | 7/1991 |
| WO | WO91/16852 | 11/1991 |
| WO | WO92/11807 | 7/1992 |
| WO | WO93/03450 | 2/1993 |
| WO | WO94/20863 | 9/1994 |
| WO | WO98/38083 | 12/1996 |
| WO | WO97/47973 | 12/1997 |
| WO | WO99/54751 | 10/1999 |
| WO | WO00/51054 | 8/2000 |
| WO | WO00/65366 | 11/2000 |

OTHER PUBLICATIONS

Lindon et al. "Biofluids Studied by NMR," In Encyclopedia of Spectroscopy and Spectrometry. Academic Press, pp. 1-22 (2000), no month.

Nicholson et al. "1H NMR spectroscopy of biological fluids and the investigation of perturbed metabolic processes," *Magnetic Resonance in Food Science*, Belton, PS et al. (eds). Royal Society of Chemistry (pubs); 40/7:12451250 (1994), no month.

Wevers et al, "High-resolution 1H-NMR spectroscopy of blood plasma for metabolic studies," Clinical Chemistry 40/7:1245-1250 (1994), no month.

"NMR Lipoprotein Subclass Analysis: NMR LipoProfile Research Service", LipoMed, Inc., 3009 New Bern Avenue, Raleigh, NC, 27610, http://www.lipoprofile.com/lipomed/ Products_Technology/R&D/R&D.htm [printed Mar. 14, 2001].

"Frequently Asked Questions", LipoMed, Inc., 3009 New Bern Avenue, Raleigh, NC, 27610, http://www.lipoprofile.com/lipomed/FAQS/faq.html [printed Mar. 14, 2001].

"Understanding the NMR LipoProfile", LipoMed, Inc., 3009 New Bern Avenue, Raleigh, NC, 27610 (2001).

"Varian Nuclear Magnetic Resonance Systems—Bayesian Software", Varian, Inc., 3120 Hansen Way, Palo Alto, CA 94304-1030, USA, http://www.varianinc.com/nmr/products/software/bayesiano-nepr.html [printed Mar. 19, 2001].

"About INCA", http://www.bruker.com/nmr/Products/INCA/index.html [printed Mar. 19, 2001], Bruker NMR, Bruker Analytik GMBH.

"INCA Siting", http://www.bruker.com/nmr/Products/INCA/inca_siting.html [printed Mar. 19, 2001], Bruker NMR, Bruker Analytik GMBH.

"INCA Configurations", http://www.bruker.com/nmr/Products/INCA/inca_config.html [printed Mar. 19, 2001], Bruker NMR, Bruker Analytik GMBH.

"About NMR Suite", http://www.bruker.com/nmr/Software/software.html [printed Mar. 19, 2001], Bruker NMR, Bruker Analytik GMBH.

"NMR Suite—AMIX", http://bruker.de/analytic/nmr-dep/nmr-softw/prodinfo/au_home/amix/index.htm [printed Mar. 19, 2001], Bruker NMR, Bruker Analytik GMBH.

"AMIX Tutorial", http://www.bruker.de/analytic/nmr-dep/nmr-softw/prodinfo/amix_aurelia/amix_tourTOC.html [printed Mar. 19, 2001], Bruker NMR, Bruker Analytik GMBH.

"Who we are", http://www.acdlabs.com/company.html [printed Mar. 19, 2001], Advanced Chemistry Development Inc., 90 Adelaide Street West, Suite 702, Toronto, Ontario, M5H 3V9, Canada.

"ACD/Labs—Spectral Laboratory", http://www.acdlabs.com/products/spec_lab [printed Mar. 19, 2001], Advanced Chemistry Development Inc., Toronto, Ontario, Canada.

"ACD/Combi NMR", http://www.acdlabs.com/products/spec_lab/complex_tasks/combinmr/tech.html [printed Mar. 19, 2001], Advanced Chemistry Development Inc., Toronto, Ontario, Canada.

"ACD/Combi NMR: Overview—Combinatorial NMR Data Processing and AnalysisSoftware", http://www.acdlabs.com/products/spec_lab/complex_tasks/combinmr [printed Mar. 19, 2001], Advanced Chemistry Development Inc., Toronto, Ontario, Canada.

"Combi NMR Interface", http://www.acdlabs.com/products/spec_lab/complex_tasks/combinmr/intr.html [printed Mar. 19, 2001], Advanced Chemistry Development Inc., Toronto, Ontario, Canada.

"NMR Spectroscopy", http://www.acdlabs.com/products/spec_lab/nmr.html [printed Mar. 19, 2001], Advanced Chemistry Development Inc., Toronto, Ontario, Canada.

"ACD/CNMR: Overview", http://www.acdlabs.com/products/spec_lab/predict_nmr/cnmr [printed Mar. 19, 2001], Advanced Chemistry Development Inc., Toronto, Ontario, Canada.

"ACD/HNMR: Overview", http://www.acdlabs.com/products/spec_lab/predict_nmr/hnmr [printed Mar. 19, 2001], Advanced Chemistry Development Inc., Toronto, Ontario, Canada.

"Software Reviews: ACD/NMR Processor", http://www.acdlabs.com/publish/acd_nmr_proc.html [printed Mar. 19, 2001], Advanced Chemistry Development Inc., Toronto, Ontario, Canada.

"CNMR Spectrum generator v4.5," http://ilab.acdlabs.com/webstore/dcnmrgen.htm [printed Mar. 19, 2001], Advanced Chemistry Development Inc., Toronto, Ontario, Canada.

"ACD/2D NMR Predictor: Overview", http://www.acdlabs.com/products/spec_lab/predict_nmr/2d_nmr [printed Mar. 19, 2001], Advanced Chemistry Development Inc., 90 Adelaide Street West, Suite 702, Toronto, Ontario, M5H 3V9, Canada.

"ACD/NMR Manager, Version 5.0 for Windows, Application Note", 2001, Advanced Chemistry Development Inc.,Toronto, Ontario, Canada, no month.

Bamforth et al "Diagnosis of inborn errors of metabolish using 1H NMR spectroscopic analysis of urine," J. Inher. Metab. Dis., SSIEM and Kluwer Academic Publishers, printed in the Netherlands, 22:297-301 (1999), no month.

Brust "NMR Chemical Shifts", Nuclear Magnetic Resonance, University of Southern Mississippi, http://www.psrc.usm.edu/macrog/nmrsft.htm [printed Nov. 28, 2000].

Brust "Nuclear Magnetic Resonance Spectroscopy", University of Southern Mississippi, http://www.psrc.usm.edu/macrog/nmr.htm [printed Nov. 28, 2000].

Buszko "A World Wide Web Interface to an NMR Spectrometer," available at <http://micro.ifas.ufl.edu> (1997, 2003), no month.

Emsley et al. "Magnetic Resonance, Historial Perspective," *Encyclopedia of Spectroscopy and Spectrometry*, Academic Press: pp. 1232-1240 (2000), no month.

Freedman et al. "Relation of Lipoprotein Subclasses as Measured by Proton Nuclear Magnetic Resonance Spectroscopy [. . . ]," Reprint from Arteriosclerosis, Thrombosis and Vascular Biology 18:1046-1053 (1998), no month.

Golotvin et al."Improved Baseline Correction of FT NMR Specta", NMR Newsletter, Oct. 1999, <http://www.acdlabs.com/publish/nmr_ar.html> (visited Oct. 30, 2001), Canada, pp. 1-3, Advanced Chemistry Development Inc., Canada.

Holmes et al "Proton NMR analysis of plasma from renal failure patients: evaluation of sample preparation and spectral-editing methods," Journal of Pharmaceutical & Biomedical Analysis 8:955-958 (1990), no month.

Holmes et al,"Automatic Data Reduction and Pattern Recognition Methods for Analysis of 1H Nuclear Magnetic Resonance Spectra of Human Urine . . . ," Analytical Biochemistry 220:284-296 (1994), no month.

Hornak "The Basics of NMR," available at <http://www.cis.rit.edu/htbooks/nmr> (1997, 2002), no month.

Lindon et al. "Biofluids Studied by NMR," In *Encyclopedia of Spectroscopy and Spectrometry*. Academic Press, pp. 98-116 (2002), no month.

Lindon et al. "Multicentre Assessment of Small Molecule Quantitation in Human Blood Plasma Using 1H NMR Spectroscopy," Journal of Magnetic Resonance Analysis, England, pp. 68-74(1996).

Lindon et al. "NMR Spectroscopy of Biofluids," Annual Reports on NMR Spectroscopy, Academic Press, ISBN 012505338X, 38:1-88 (1999), no month.

Nicholson et al "750 MHz 1H and 1H-13C NMR Spectroscopy of Human Blood Plasma," Analytical Chemistry, 67:793-811 (1995), no month.

Nicholson et al. "Metabonomics: understanding the metabolic responses of living systems [. . . ] via multivariate statistical analysis of biological NMR spectroscopic data," Xenobiotica, UK, 29:1181-1189 (1999), no month.

"Nuclear Magnetic Resonance with a 300 MHz Fourier Transform Spectrometer," Modern Physics Laboratory Manual, Middlebury College, Dept. of Physics, USA, <http://www.middlebury.edu/-PHManual/nuclearmag.html> (1992, 1993, 2001), no month.

Press et al. "Parabolic Interpolation and Brent's Method in One Dimension," *Numerical Recipes in C—The Art of Scientific Computing*, Second edition, Cambridge University Press, pp. 402-405, USA (1992), no month.

Robertson et al. "Metabonomics: Evaluation of Nuclear Magnetic Resonance (NMR) and Pattern Recognition Technology for [ . . . ] Toxicants," Toxicological Sciences 57:326-337 (2000), no month.

Smith et al."Nuclear Magnetic Resonance Spectroscopy," Analytical Chemistry, vol. 34:509R-518R (1995), no month.

Spraul et al "Flow Injection Proton [NMR] Spectroscopy Combined With Pattern Recognition Methods [. . . ]," Analytical Communications, Royal Society of Chemistry (UK) 34:1-3 (1997), no month.

Sykes et al. "Checking pH without an Electrode", The NMR Newsletter, 966 Elsinore Court Palo Alto, CA, 94303, Jun. 30, 1998 (received Jul. 3, 1998), 479-11 and 479-12 (1998).

Williams et al. "The ABC of Metabonomics: Automated Baseline Correction," Mar. 11-16, 2001, Orlando, Florida, USA, 42nd ENC, ACD Users Meeting, pp. 1-8 (2001).

Wishart et al. "Magnetic Resonance Diagnostics: A New Technology for High-Throughput Clinical Diagnostics," Clin Chem 47:1918-1921 (2001), no month.

Pan "Correlation Of Lactate and Ph In Human Skeletal Muscle After Exercise By 1H NMR" Magnetic Resonance In Medicine 20:57-65 ( 1991), no month.

El-Deredy "Pattern Recognition Approaches in Biomedical and Clinical Magnetic Resonance Spectroscopy: A Review," NMR In Biomedicine10: 99-124 n(1997), no month.

Kurhanewicz "Citrate Alterations in Primary and Metastatic Human Prostatic Adenocarcinomas: $^1$H Magnetic Resonance Spectroscopy and Biochemical Study," Magnetic Resonance In Medicine 29: 149-157 (1993).

Levy et al."Data Processing" *Encyclopedia Of Nuclear Magnetic Resonance*, D.M.Grant et al. (eds.), John Wiley & Sons, vol. 3, pp. 1548-1558 (1996), no month.

Spraul et al.; "Automatic Reduction of NMR Spectroscopic Data for Statistical and Pattern Recognition Classification of Samples," Journal Of Pharmaceutical And Biochemical Analysis 12: 1215-1225 (1994), no month.

* cited by examiner

REAL SPECTRAL DATA - pH=5.10

```
<?xml version="1.0"?>
<!--compoundDB version="2.0"-->
<compound>
  <name>LacticAcid</name>
  <molecularWeight>90.08</molecularWeight>
```
⎫ 200

```
<experiment>
<pH>5.1</pH>
<temperatureKelvin>298.150000</temperatureKelvin>
<DSSRatio>0.533668</DSSRatio>
<concentration>4.308710</concentration>
<timestamp>Sept 5 2001</timestamp>
<sourceFID>lacticacid.fid</sourceFID>
<magnetMHz>400.120773</magnetMHz>
<spectralWidthHz>6006.006006</spectralWidthHz>
</experiment>
```
⎫ 202

```
<cluster>                                              ⟵ 206
  <protonNumber>3</protonNumber>                       ⟵ 210
  <quantification>1</quantification>                   ⟵ 212
  <subCluster>
    <centerPPM>1.321559</centerPPM>
    <lorentzianWidthAdjust>2.893258</lorentzianWidthAdjust>  ⟵ 214
    <peak>
      <offsetCenterHz>-3.455480</offsetCenterHz>       ⟵ 220
      <height>0.988680</height>                        ⟵ 222     ⎫ 216
      <protonRatio>1.491461</protonRation>             ⟵ 224
    </peak>
    <peak>
      <offsetCenterHz>3.455480</offsetCenterHz>
      <height>1.0000000</height>                                 ⎫ 218
      <protonRation>1.508539</protonRatio>
    </peak>
  </subCluster>
</cluster>
```
⎫ 204

FIG. 7A

```xml
<cluster>                                              ←208
    <protonNumber>1</protonNumber>
    <quantification>0</quantification>
    <subCluster>
        <centerPPM>4.118849</centerPPM>
        <lorentzianWidthAdjust>13.441432<lorentzianWidthAdjust>
        <peak>
            <offsetCenterHz>-10.366999</offsetCenterHz>
            <height>0.057244</height>
            <protonRatio>0.130861</protonRatio>
        </peak>
        <peak>
            <offsetCenterHz>-3.43221144</offsetCenterHz>
            <height>0.164751</height>
            <protonRatio>0.376629</protonRatio>
        </peak>
        <peak>
            <offsetCenterHz>3.487744</offsetCenterHz>
            <height>0.161840</height>
            <protonRatio>0.369975</protonRatio>
        </peak>
        <peak>
            <offsetCenterHz>10.366999</offsetCenterHz>
            <height>0.053601</height>
            <protonRatio>0.122535</protonRatio>
        </peak>
    </subCluster>
</cluster>
</compound>
```
} 204

FIG. 7B

Real Spectral Data - pH=5.45

```
< ?xml version="1.0"? >
< !-- compoundDB version="2.0" -- >
< compound >
 < name > LacticAcid < /name >
 < molecularWeight > 90.08 < /molecularWeight >

< experiment >
  < pH > 5.45 < /pH >
  < temperatureKelvin > 298.150000 < /temperatureKelvin >
  < DSSRatio > 0.533668 < /DSSRatio >
  < concentration > 4.308710 < /concentration >
  < timestamp > Sept 5 2001 < /timestamp >
  < sourceFID > lacticacid.fid < /sourceFID >
  < magnetMHz > 400.120699 < /magnetMHz >
  < spectralWidthHz > 6006.006006 < /spectralWidthHz >
 < /experiment >

< cluster >
  < protonNumber > 3 < /protonNumber >
  < quantification > 1 < /quantification >
  < subCluster >
   < centerPPM > 1.318770 < /centerPPM >
   < lorentzianWidthAdjust > 1.562004 < /lorentzianWidthAdjust >
   < peak >
    < offsetCenterHz > -3.453329 < /offsetCenterHz >
    < height > 0.983656 < /height >
    < protonRatio > 1.487641 < /protonRatio >
   < /peak >
   < peak >
    < offsetCenterHz > 3.453329 < /offsetCenterHz >
    < height > 1.000000 < /height >
    < protonRatio > 1.512359 < /protonRatio >
   < /peak >
  < /subCluster >
 < /cluster >
```

FIG. 13A

```
<cluster>
  <protonNumber>1</protonNumber>
  <quantification>0</quantification>
  <subCluster>
    <centerPPM>4.110990</centerPPM>
    <lorentzianWidthAdjust>7.044502</lorentzianWidthAdjust>
    <peak>
      <offsetCenterHz>-10.371092</offsetCenterHz>
      <height>0.054671</height>
      <protonRatio>0.124148</protonRatio>
    </peak>
    <peak>
      <offsetCenterHz>-3.448909</offsetCenterHz>
      <height>0.164509</height>
      <protonRatio>0.373572</protonRatio>
    </peak>
    <peak>
      <offsetCenterHz>3.456819</offsetCenterHz>
      <height>0.163879</height>
      <protonRatio>0.372141</protonRatio>
    </peak>
    <peak>
      <offsetCenterHz>10.371092</offsetCenterHz>
      <height>0.057309</height>
      <protonRatio>0.130139</protonRatio>
    </peak>
  </subCluster>
</cluster>
</compound>
```

FIG. 13B

Interpolated Data - pH=5.28

```
<?xml version="1.0"?>
<!-- compoundDB version="2.0" -->
<compound>
 <name>LacticAcid<//name>
 <molecularWeight>90.08</molecularWeight>

<experiment>
  <pH>5.45</pH>
  <temperatureKelvin>298.150000</temperatureKelvin>  : copied
  <DSSRatio>0.533668</DSSRatio>
  <concentration>4.308710</concentration>
  <timestamp>Sept 5 2001</timestamp>
  <sourceFID>lacticacid.fid</sourceFID>  :copied
  <magnetMHz>400.120699</magnetMHz>
  <spectralWidthHz>6006.006006</spectralWidthHz>
 </experiment>

<cluster>
  <protonNumber>3</protonNumber>
  <quantification>1</quantification>
  <subCluster>
   <centerPPM>1.3202</centerPPM>  : interpolated
   <lorentzianWidthAdjust>1.562004</lorentzianWidthAdjust>
   <peak>
    <offsetCenterHz>-3.453329</offsetCenterHz>
    <height>0.983656</height>
    <protonRatio>1.487641</protonRatio>
   </peak>
   <peak>
    <offsetCenterHz>3.453329</offsetCenterHz>
    <height>1.000000</height>
    <protonRatio>1.512359</protonRatio>
   </peak>
  </subCluster>
 </cluster>
```

FIG. 14A

```
<cluster>
  <protonNumber>1</protonNumber>
  <quantification>0</quantification>
  <subCluster>
    <centerPPM>4.1149</centerPPM>  :interpolated
    <lorentzianWidthAdjust>7.044502</lorentzianWidthAdjust>
    <peak>
      <offsetCenterHz>-10.371092</offsetCenterHz>
      <height>0.054671</height>
      <protonRatio>0.124148</protonRatio>
    </peak>
    <peak>
      <offsetCenterHz>-3.448909</offsetCenterHz>
      <height>0.164509</height>
      <protonRatio>0.373572</protonRatio>
    </peak>
    <peak>
      <offsetCenterHz>3.456819</offsetCenterHz>
      <height>0.163879</height>
      <protonRatio>0.372141</protonRatio>
    </peak>
    <peak>
      <offsetCenterHz>10.371092</offsetCenterHz>
      <height>0.057309</height>
      <protonRatio>0.130139</protonRatio>
    </peak>
  </subCluster>
</cluster>
</compound>
```

FIG. 14B

Generic Lactic Acid record

```xml
<?xml version="1.0"?>
<!-- compoundDB version="2.0" -->
<compound>
 <name>LacticAcid</name>
 <molecularWeight>90.08</molecularWeight>

<experiment>
  <pH>5.45</pH>
  <temperatureKelvin>298.150000</temperatureKelvin>
  <DSSRatio>0.533668</DSSRatio>
  <concentration>4.308710</concentration>
  <timestamp>Sept 5 2001</timestamp>
  <sourceFID>lacticacid.fid</sourceFID>
  <magnetMHz>400.120699</magnetMHz>
  <spectralWidthHz>6006.006006</spectralWidthHz>
 </experiment>

<cluster>
  <protonNumber>3</protonNumber>
  <quantification>1</quantification>
  <subCluster>
   <centerPPM>y=m₁(pH)+b₁</centerPPM>
   <lorentzianWidthAdjust>1.562004</lorentzianWidthAdjust>
   <peak>
    <offsetCenterHz>-3.453329</offsetCenterHz>
    <height>0.983656</height>
    <protonRatio>1.487641</protonRatio>
   </peak>
   <peak>
    <offsetCenterHz>3.453329</offsetCenterHz>
    <height>1.000000</height>
    <protonRatio>1.512359</protonRatio>
   </peak>
  </subCluster>
 </cluster>
```

FIG. 15A

```
<cluster>
  <protonNumber>1</protonNumber>
  <quantification>0</quantification>
  <subCluster>
    <centerPPM> y=m_2(pH)+b_2 </centerPPM>
    <lorentzianWidthAdjust>7.044502</lorentzianWidthAdjust>
    <peak>
      <offsetCenterHz>-10.371092</offsetCenterHz>
      <height>0.054671</height>
      <protonRatio>0.124148</protonRatio>
    </peak>
    <peak>
      <offsetCenterHz>-3.448909</offsetCenterHz>
      <height>0.164509</height>
      <protonRatio>0.373572</protonRatio>
    </peak>
    <peak>
      <offsetCenterHz>3.456819</offsetCenterHz>
      <height>0.163879</height>
      <protonRatio>0.372141</protonRatio>
    </peak>
    <peak>
      <offsetCenterHz>10.371092</offsetCenterHz>
      <height>0.057309</height>
      <protonRatio>0.130139</protonRatio>
    </peak>
  </subCluster>
</cluster>
</compound>
```

FIG. 15B

Generic Lactic Acid record with Lookup Table link

```xml
<?xml version="1.0"?>
<!-- compoundDB version="2.0" -->
<compound>
  <name>LacticAcid</name>
  <molecularWeight>90.08</molecularWeight>

<experiment>
   <pH>5.45</pH>
   <temperatureKelvin>298.150000</temperatureKelvin>
   <DSSRatio>0.533668</DSSRatio>
   <concentration>4.308710</concentration>
   <timestamp>Sept 5 2001</timestamp>
   <sourceFID>lacticacid.fid</sourceFID>
   <magnetMHz>400.120699</magnetMHz>
   <spectralWidthHz>6006.006006</spectralWidthHz>
  </experiment>

<cluster>
   <protonNumber>3</protonNumber>
   <quantification>1</quantification>
   <subCluster>
    <centerPPM>LOOKUP TABLE LINK1</centerPPM>
    <lorentzianWidthAdjust>1.562004</lorentzianWidthAdjust>
    <peak>
     <offsetCenterHz>-3.453329</offsetCenterHz>
     <height>0.983656</height>
     <protonRatio>1.487641</protonRatio>
    </peak>
    <peak>
     <offsetCenterHz>3.453329</offsetCenterHz>
     <height>1.000000</height>
     <protonRatio>1.512359</protonRatio>
    </peak>
   </subCluster>
  </cluster>
```

FIG. 16A

```
<cluster>
  <protonNumber>1</protonNumber>
  <quantification>0</quantification>
  <subCluster>
    <centerPPM> LOOKUP TABLE LINK2 </centerPPM>
    <lorentzianWidthAdjust>7.044502</lorentzianWidthAdjust>
    <peak>
      <offsetCenterHz>-10.371092</offsetCenterHz>
      <height>0.054671</height>
      <protonRatio>0.124148</protonRatio>
    </peak>
    <peak>
      <offsetCenterHz>-3.448909</offsetCenterHz>
      <height>0.164509</height>
      <protonRatio>0.373572</protonRatio>
    </peak>
    <peak>
      <offsetCenterHz>3.456819</offsetCenterHz>
      <height>0.163879</height>
      <protonRatio>0.372141</protonRatio>
    </peak>
    <peak>
      <offsetCenterHz>10.371092</offsetCenterHz>
      <height>0.057309</height>
      <protonRatio>0.130139</protonRatio>
    </peak>
  </subCluster>
</cluster>
</compound>
```

FIG. 16B

AUTOMATIC IDENTIFICATION OF COMPOUNDS IN A SAMPLE MIXTURE BY MEANS OF NMR SPECTROSCOPY

CROSS-REFERENCES TO RELATED APPLICATIONS

This application is a divisional of pending U.S. application Ser. No. 10/416,988 filed May 16, 2003, filed pursuant to 35 U.S.C. § 371 as a National Phase Application of International Application Ser. No. PCT/CA01/01544, filed Nov. 1, 2001, which claims priority from Canadian Patent Application Serial No. 2,331,116 filed Jan. 15, 2001.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

1. Field of the Invention

This invention relates to qualitative and quantitative chemical analysis, and more particularly to processes, apparatus, media and signals for automatically identifying compounds in a sample.

2. Description of Related Art

The field of biometric identification has grown tremendously over the recent decade both from its relevance to medical diagnostics and to its application as a way to uniquely identify a person or an animal, for example. As diagnostic tools have become more sophisticated, complex liquid mixtures, such as human blood or urine for example, can now be analyzed to identify or search for particular compounds that can provide important diagnostic information to a medical technician or a doctor.

Generally, the separation and characterization of mixtures is fundamental to nearly every aspect of analytical chemistry and biochemistry. Most approaches to identify and quantify biological compounds in liquid mixtures require an initial compound separation (chromatographic or physical separation) step to separate a particular compound or set of compounds from the mixture. For example, gas chromatography, electrophoresis, and liquid chromatography are used to separate pure chemical components/compounds, for example, from a mixture before analysis is performed. Initial compound separation is required because most spectral identification processes, such as mass spectrometry or infrared, visible, and ultraviolet spectroscopy, require relatively pure samples in order to minimize noise and increase the accuracy of the measuring device. Spectral identification processes are expensive, manually intensive and require a great deal of technical expertise to be performed properly in an accurate, timely manner.

Nuclear magnetic resonance (NMR) has recently been shown to be an alternative approach to identify and quantify biological compounds without chromatographic separation. In this approach, radio frequency (RF) electromagnetic radiation is applied to a mixture of organic compounds to extract and measure a characteristic RF absorption spectrum of nuclei belonging to each specific organic compound. A large number of compounds are associated with well-defined peaks in the absorption spectrum and knowing which peaks are associated with certain compounds makes it possible to manually identify some of the compounds in the liquid mixture without resorting first to chromatographic separation. However, this process is still quite slow and requires a great deal of a priori information that relates each peak to a given compound. It can take a number of years for experts in NMR spectroscopy to acquire the knowledge required to analyze NMR spectra to accurately identify and quantify compounds in sample mixtures.

Therefore what is desired is a process and apparatus for quickly, accurately and automatically identifying a number of compounds which may be present in complex liquid mixtures without involving chromatographic separation and without requiring people who are experts in NMR techniques.

SUMMARY OF THE INVENTION

Overall Process

The embodiments of the invention disclosed herein provide for automated, accurate analysis of a test spectrum obtained from a sample, to quantitatively and qualitatively identify compounds present in the sample.

In accordance with one aspect of the invention there is provided a computer-implemented process for automatically identifying compounds in a sample mixture, the process comprising receiving a representation of a measured condition of the sample mixture, using said representation of a measured condition of the sample mixture to select a set of reference spectra of compounds suspected to be contained in said sample mixture, from a library of reference spectra, receiving a representation of a test spectrum having peaks associated with compounds therein, said test spectrum being produced from the sample mixture under said measured condition, and combining reference spectra from said set of reference spectra to produce a matching composite spectrum having peaks associated with at least some of said suspected compounds, that match peaks in said test spectrum, the compounds associated with the reference spectra that combine to produce the matching spectrum being indicative of the compounds in the sample mixture.

In accordance with another aspect of the invention, there is provided a computer-readable medium for providing computer readable instructions for directing a processor circuit to execute the process described above.

In accordance with another aspect of the invention, there is provided a signal embodied in a carrier wave, the signal having code segments for providing computer readable instructions for directing a processor circuit to execute the process described above.

In accordance with another aspect of the invention, there is provided an apparatus for identifying compounds in a sample. The apparatus includes a processor circuit programmed to execute the process described above.

In accordance with another aspect of the invention there is provided an apparatus for identifying compounds in a sample, the apparatus comprising means for receiving a representation of a measured condition of the sample mixture, means for using said representation of a measured condition of the sample mixture to select a set of reference spectra of compounds suspected to be contained in said sample mixture, from a library of reference spectra, means for receiving a representation of a test spectrum, produced from the sample mixture under said measured conditions, and means for combining reference spectra from said set of reference spectra to produce a matching composite spectrum having peaks representing at least some of said suspected compounds, that match peaks said test spectrum, the compounds associated with the reference spectra that combine to produce the matching spectrum being the compound in the sample mixture.

In accordance with another aspect of the invention there is provided a process for producing a trace file for use in spectrum analysis. The process involves performing a Fourier Transform on Free Induction Decay (FID) data to produce an initial spectrum, filtering a selected region of the initial spectrum to produce a filtered spectrum and phasing the filtered spectrum to produce a measured spectrum having a flat baseline and well defined positive peaks.

In accordance with another aspect of the invention there may be provided a computer readable medium and/or a signal for providing codes operable to direct a processor circuit to produce a trace file for use in spectrum analysis according to the process described above.

In accordance with another aspect of the invention there is provided an apparatus for producing a trace file for use in spectrum analysis, the apparatus has a device for automatically performing a Fourier Transform on Free Induction Decay (FID) data to produce an initial spectrum, a device for automatically filtering a selected region of the initial spectrum to produce a filtered spectrum and a device for automatically phasing the filtered spectrum to produce a measured spectrum having a flat baseline and well defined positive peaks.

In accordance with another aspect of the invention there is provided a process for producing a representation of a spectrum for a hypothetical solution containing a compound, for use in determining the composition of a test sample. The process involves producing a position value for at least one peak of a reference spectrum as a function of a condition of the test sample, and a property of the at least one peak in a base reference spectrum.

In accordance with another aspect of the invention there is provided a computer-readable medium for providing computer readable instructions for causing a processor circuit to execute the process for producing a representation of a spectrum for a hypothetical solution as described above.

In accordance with another aspect of the invention there is provided a signal having a segment comprising codes operable to cause a processor circuit to execute the process for producing a representation of a spectrum for a hypothetical solution as described above.

In accordance with another aspect of the invention there is provided an apparatus for executing the process for producing a representation of a spectrum for a hypothetical solution described above. The apparatus has a processor circuit programmed to produce a position value for at least one peak of a reference spectrum as a function of a measured condition of the test sample, and a property of the at least one peak in a base reference spectrum.

In accordance with another embodiment, there is provided an apparatus for producing a representation of a spectrum for a hypothetical solution containing a compound, for use in determining the composition of a test sample under a certain condition. The apparatus has a device for receiving a value representing a measured condition of the test sample, a device for receiving a representation of a position of at least one peak in a base reference spectrum and a device for producing a position value for at least one peak of a derived reference spectrum as a function of the measured condition of the test sample, and a property of the at least one peak in a base reference spectrum.

Other aspects and features of the present invention will become apparent to those ordinarily skilled in the art upon review of the following description of specific embodiments of the invention in conjunction with the accompanying Figures.

BRIEF DESCRIPTION OF THE DRAWINGS

In drawings which illustrate embodiments of the invention,

FIGS. 7A and 7B are a tabular representation of an Extensible Markup Language (XML) file representation of the reference spectrum of FIG. 6;

FIGS. 13A and 13B are a tabular representation of a base reference spectrum record associated with lactic acid at a pH of 5.45;

FIGS. 14A and 14B are a tabular representation of a derived reference spectrum record associated with lactic acid at a pH of 5.28;

FIGS. 15A and 15B are a tabular representation of a generic type of derived reference record in which equations specify center Parts Per Million (PPM) values for peak clusters, according to one embodiment of the invention;

FIGS. 16A and 16B are a tabular representation of a derived record comprising look-up table links to center PPM values according to another embodiment of the invention;

DETAILED DESCRIPTION

Figure 1:
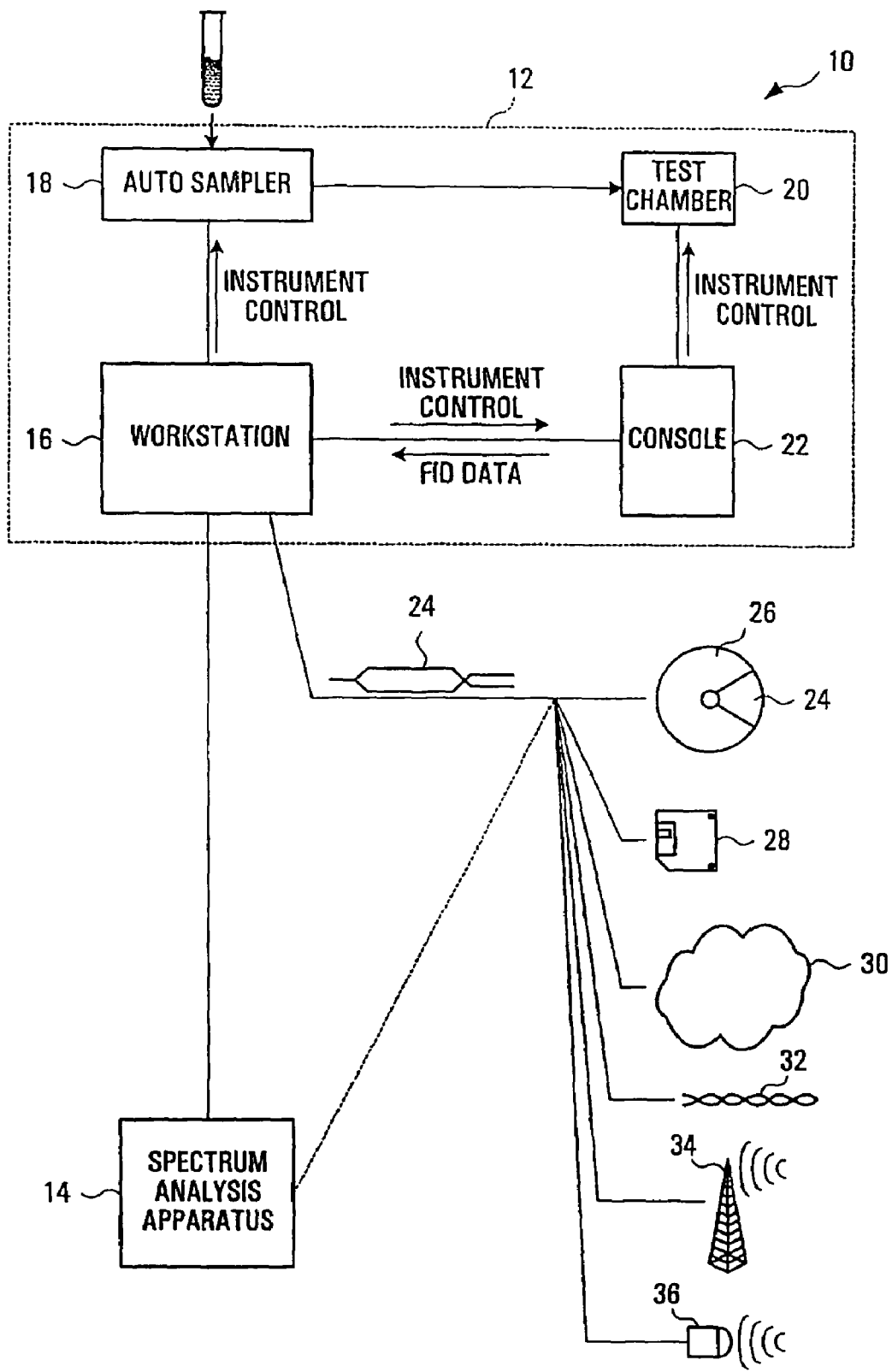
FIG. 1 is a system for determining the quantity of compounds in a test sample, according to a first embodiment of the invention.

Referring to FIG. 1, a system, according to a first embodiment of the invention, for determining the quantity of compounds in a test sample is shown generally at 10. The system includes a spectrum producing apparatus 12 and a spectrum analysis apparatus shown generally at 14. In this embodiment, the spectrum producing apparatus 12 is a Nuclear Magnetic Resonance (NMR) System provided by Varian Inc. of California, U.S.A. Generally, the system is operable to receive a specially prepared liquid biological test sample and produce a data file comprised of a plurality of (x,y) values which define a measured NMR spectrum. This measured NMR spectrum is then supplied to the spectrum analysis apparatus 14, where a process according to another aspect of the invention is carried out to provide an indication of the quantities of certain compounds in the specially prepared biological test sample.

The system 10 is suitable for use with biological samples, for example blood or urine, in which the solvent is water, for example. Such samples may be "prepared" by doping them with a small quantity of a condition indicator compound, also referred to as a condition reference compound, and a chemically inert chemical shift calibration standard compound also referred to as a calibration compound. The condition indicator may be trimethylsilyl-1-propanoic acid or Imidazole, where the distortion factor is pH, for example. Alternatively, the sample itself may have a naturally occurring, inherent condition indicator such as glycine, creatinine, urea, citrate, or trimethylamine-N-oxide, for example. The chemical shift calibration standard compound may be 3[trimethylsilyl]-1-propanesulfonic acid, also known as DSS, for example. Alternatively, the chemical shift calibration standard may be dimethylsulphoxide (DMSO), acetone, or tetramethylsilane (TMS), for example.

In this embodiment, the spectrum producing apparatus 12 is comprised of a computer workstation 16, an auto sampler 18, a test chamber 20, and a console 22. The workstation is a Sun Workstation with a 400 MHz UltraSPARC IIi CPU with 2 MB level 2 cache, 128 MB RAM, on-board PGX24 graphics controller, 20 GB 7200 r.p.m. EIDE hard disk 48x CD-ROM drive 1.44 MB floppy drive and 17" flat screen color monitor. The workstation runs Varian VNMR software which includes routines for controlling the auto sampler 18 and the console 22 to cause the specially prepared biological liquid sample to be received in the test chamber 20 and to cause the console to acquire and provide to the workstation Free Induction Decay (FID) data representing the free induction decay of electromagnetic radiation absorptions produced by protons in the compounds of the liquid sample as a result of changes in magnetic properties of the protons due to a nuclear magnetic resonance process initiated in the test chamber 20 by the console 22.

Process for Producing a Measured Spectrum

The FID data is received and stored in memory at the workstation 16. Then, in this embodiment, a process according to an embodiment of another aspect of the invention, is carried out to cause the workstation to produce a measured spectrum for use by the spectrum analysis apparatus 14. Instructions for directing the workstation to automatically carry out the process for producing the measured spectrum are embodied in computer readable codes 24. These computer readable codes 24 may be provided to the workstation 16 in a variety of different forms including a file or files on a computer readable medium such as a CD-ROM 26, or floppy disk 28, for example, or as a file received as a signal from a communications medium such as an internet 30, extranet or intranet, electrical 32, Radio Frequency (RF) 34, or optical medium 36 or any other medium by which a file comprised of said codes may be provided to the workstation 16 to enable the workstation to be directed by the codes to execute the process describecd herein to produce a measured spectrum.

Autoprocessing

Generally, an automatic computer-implemented process for producing a measured spectrum from NMR data, may involve operating on free induction decay (FID) data produced by a spectrometer to produce a trace file comprised of intensity and frequency values representing a measured spectrum having a flat baseline and well defined peaks that have positive, well-defined areas, for use in a computer-implemented spectrum analysis process such as the process described herein. In particular, the process may involve performing a Fourier Transform on Free Induction Decay (FID) data to produce an initial spectrum, filtering a selected region of the initial spectrum to produce a filtered spectrum and phasing the filtered spectrum to produce a measured spectrum having a flat baseline and well defined positive peaks.

Figure 2:
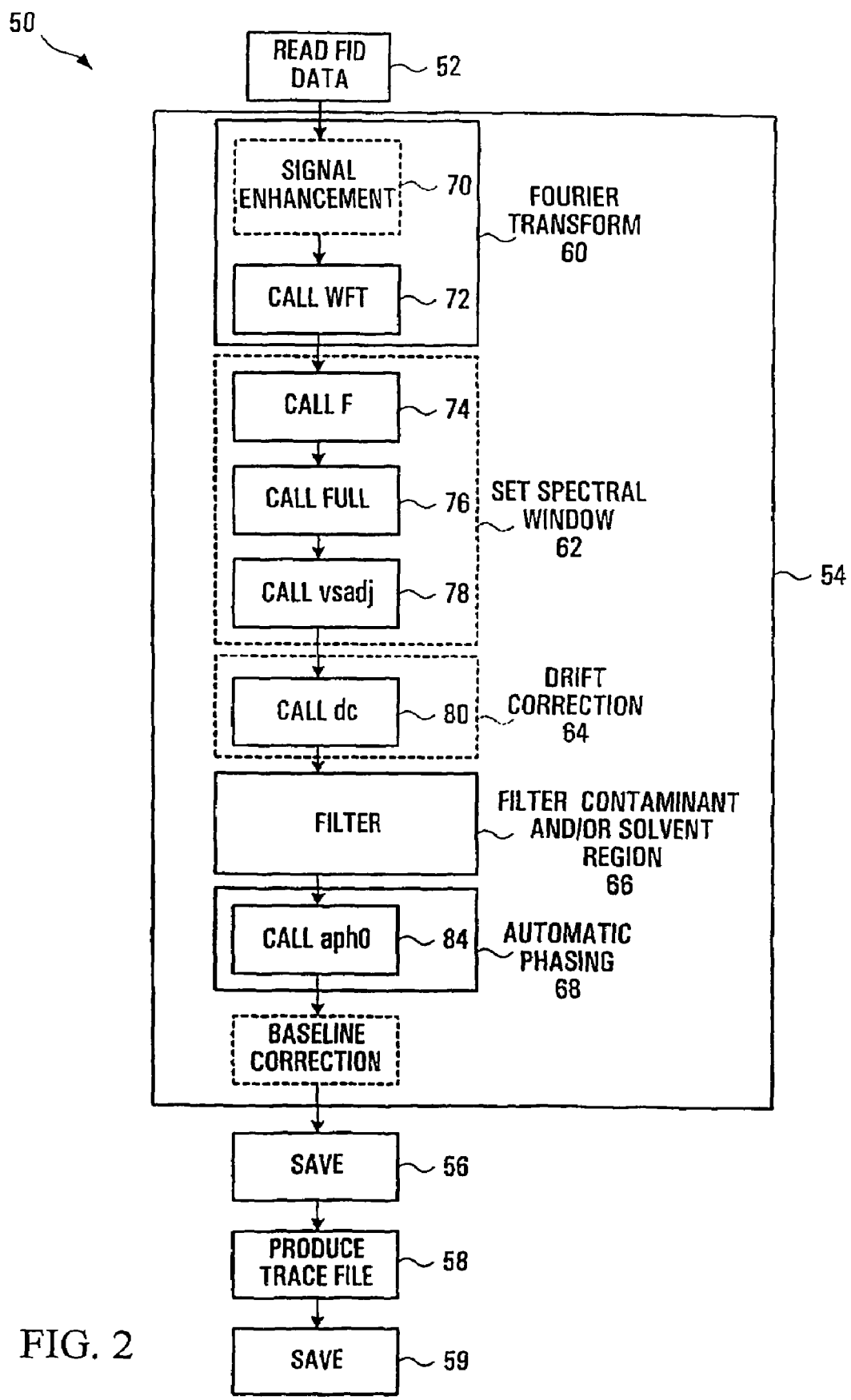
FIG. 2 is a flow chart illustrating an automatic process for conditioning a measured spectrum, as implemented by a workstation shown in FIG. 1.

Referring to FIG. 2, a flowchart depicting functional blocks implemented by the codes to cause the workstation to execute a specific process for producing a measured spectrum is shown generally at 50. The process begins with a first block 52 that causes the workstation 16 to read and perform an initial Weighted Fourier Transform on the FID data to produce an initial measured spectrum representing signal intensity (i) versus frequency (F).

Then block 54 causes the workstation 16 to produce parameters for use in a later-executed Fourier Transform performed on the FID data to produce a representation of a measured spectrum having well defined Lorentzian lines with a flat baseline and peaks that have positive, well-defined areas. Thus, the result of block 54 is a set of parameters that controls Fourier Transforms later performed on the FID data to produce a representation of a measured spectrum.

Block 56 directs the workstation to save the set of parameters in association with the FID data. Block 58 directs the workstation 16 to perform a Fourier Transform on the FID data, using the parameters produced by block 54 to produce a trace file, which is a file comprised of a plurality of (x,y) values that represent a trace of the measured spectrum, representing intensity versus frequency. Block 59 then causes the workstation to save the trace file for transmission to the spectrum analysis apparatus 14 shown in FIG. 1.

Figure 3:
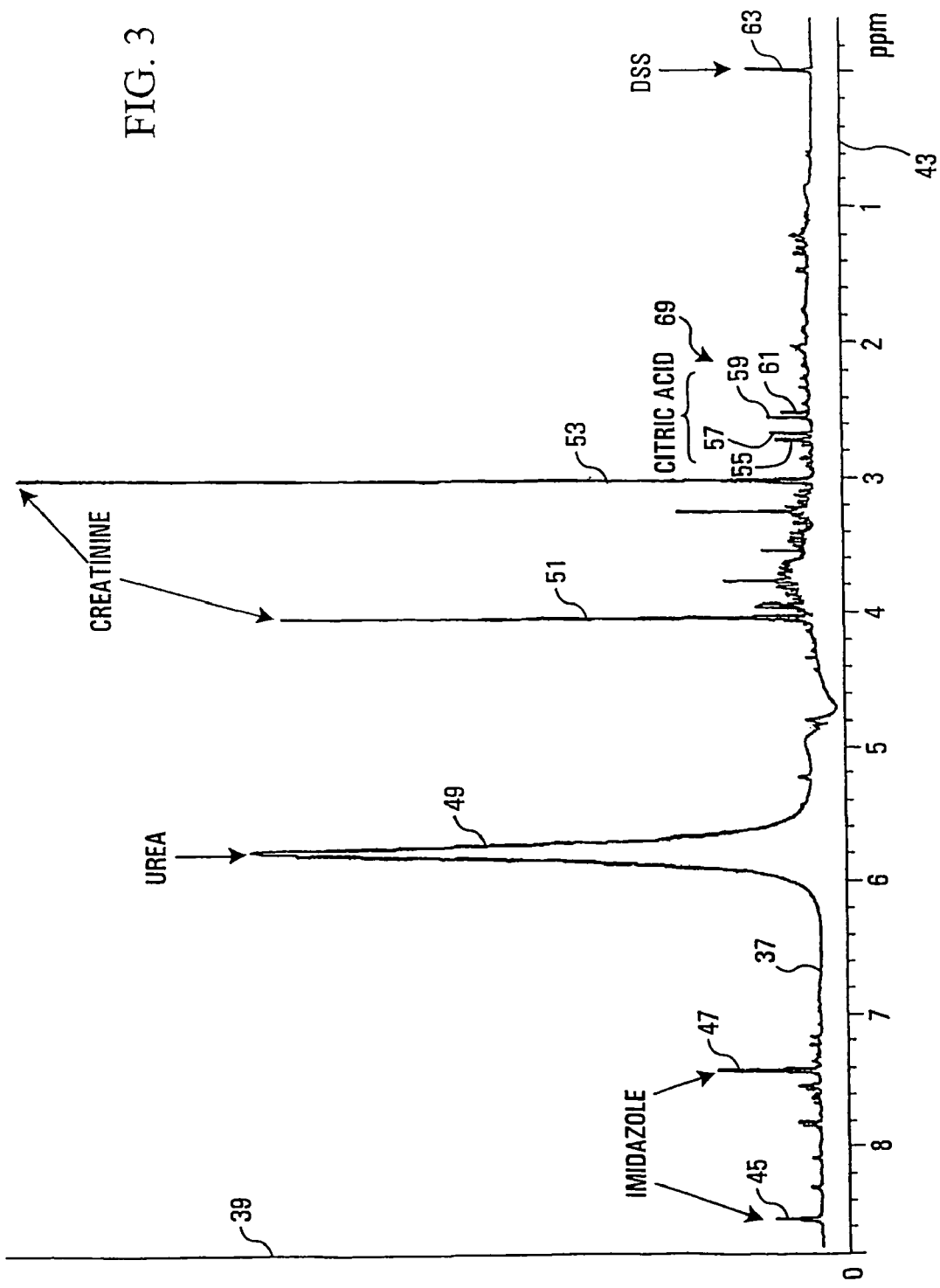
FIG. 3 is a pictorial representation of a measured spectrum produced by the workstation shown in FIG. 1.

An example of a measured spectrum is shown generally at 41 in FIG. 3. The spectrum is a plot of intensity versus frequency. The x-axis 43 is referenced to parts per million (ppm) and depicts a window of the overall spectrum, the window containing relevant information or features for identifying compounds in the sample. The y-axis 39 is referenced to a zero value and the spectrum has a baseline 37 representing a noise level from which a plurality of peaks 45, 47, 49, 51, 53, 55, 57, 59, 61, 63 associated with various compounds in the sample extend. For example peaks 45 and 47 are associated with Imidazole, peak 49 is associated with Urea and peaks 51 and 53 are associated with Creatinine. Peaks 55 and 57 form a first cluster associated with citric acid and peaks 59 and 61 form a second cluster associated with that compound. Peak 63 is associated with DSS, the calibration compound.

Referring back to FIG. 2, block 54 which processes the FID data, is shown in greater detail. Block 54 includes sub-functional blocks including a Fourier Transform block 60, a filter selected and/or solvent region block 66 and an automatic phasing block 68, each of which is automatically executed in turn, in the order shown. The process may include an optional spectral window setting block 62 and an optional drift correction block 64, to further process the spectrum, for example.

The Fourier Transform block 60 has an optional sub-block 70 that causes the workstation to perform a weighted Fourier Transform with weights that provide for enhancement of the initial spectrum. These weights may perform a line broadening function to the initial spectrum, for example. To do this in this embodiment, block 70 causes the workstation to set signal enhancement parameters for use in a subsequently executed weighted Fourier Transform block 72. Such signal enhancement parameters may effect line broadening, line narrowing, or gaussian sine-bell conditioning, for example, to the resulting spectrum produced by the Fourier Transform block 72. In the Varian VNMR software, this is effected by setting a line broadening variable "lb" to a specified value, which may be 0.5, for example. Also in the VNMR software, the weighted Fourier Transform may be executed by calling the VNMR macro "wft" to perform a weighted Fourier Transform on the FID data, using the lb parameter value set at block 70. This has the effect of broadening the lines or peaks of the spectrum and averaging the spectrum to produce a measured spectrum with a better signal to noise ratio than would be produced without averaging. It also has the effect of eliminating glitches to produce a measured spectrum of better quality.

In this embodiment optional block 62 causes the workstation 16 to define a window on the initial spectrum and this may involve scaling the initial spectrum. It is desirable to set the spectral window to a preset size, i.e. a pre-defined range of frequency, to enable the acquisition of repeatable data and for all useful data to be in a pre-defined window and to scale the spectrum such that the height of its maximum peak is a percentage of the height of the window. In this embodiment, this is effected through the VNMR software by executing three sub-functional blocks 74, 76 and 78 that cause the workstation 16 to call the VNMR macros "f", "full", and the VNMR command "vsadj", respectively, in the order shown. The 'f' macro sets display parameters "sp" and "wp" for a full display of a 1D spectrum, the 'full' macro sets display limits for a full screen so that the spectrum can be seen as wide as possible in the window, and the 'vsadj' command sets up automatically the vertical scale "vs" in the absolute intensity mode "ai", so that the largest peak is of the required height. Effectively this provides for scaling of the spectrum so that the highest peak is 90% of the total window height.

Optional block 64 causes the workstation to produce parameters that perform drift correction on the spectrum to correct the measured spectrum for drift effects, effectively setting the two extremes of the baseline of the spectrum, i.e. the left and right sides of the spectrum to have zero slope. In this embodiment, using the Varian VNMR software, this is achieved by block 80 which causes the workstation 16 to call the "dc" macro of the VNMR software. Effectively the "dc" macro calculates a linear baseline correction. The beginning and end of a straight line to be used for baseline correction are determined from the display parameters "sp" and "wp". The "dc" command applies this correction to the spectrum and stores the definition of the straight line in the parameters "lvl" (level) and "tlt" (tilt) of the VNMR software. (cdc resets the parameters "lvl" and "tlt" to zero.)

Block 66 causes the workstation to filter a selected region of the spectrum to adjust the intensity of the spectrum in that region. Filtering may involve applying a notch filter to a selected or solvent region, for example, to suppress a peak associated with a contaminant or solvent in the contaminant or solvent region. This ensures that the solvent region or contaminant region of the spectrum is correctly phased with the rest of the spectrum so that the entire spectrum can be properly phased later. In order to permit the entire spectrum to be phased, the solvent or contaminant residual must be in phase with the rest of the spectrum, ideally reducing the solvent or contaminant region to zero. The solvent region is the region of the spectrum in which solvent compounds in the sample may be found. For example the solvent may be water, in which case the region around the peak in the measured spectrum associated with the compound $H_2O$ is considered to be the solvent region. The contaminant region is a region of the spectrum where peaks associated with contaminants are present.

Figure 4:
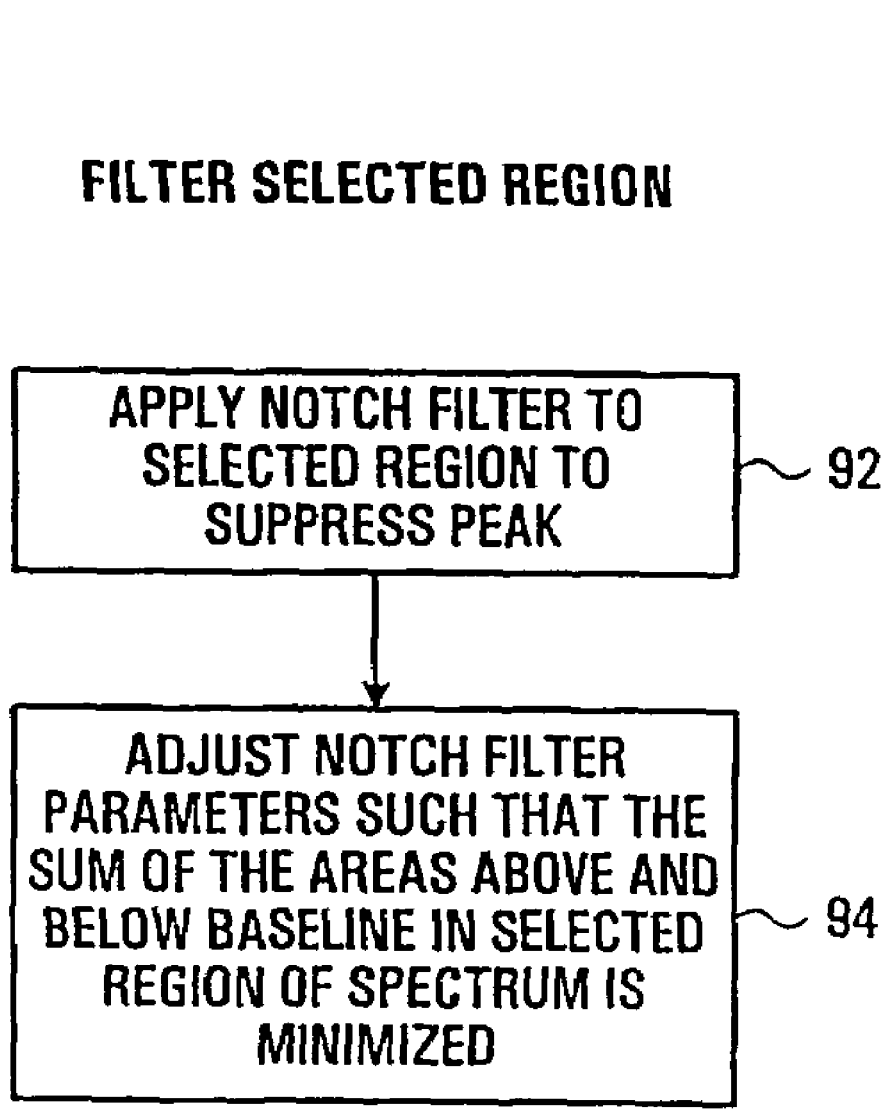
FIG. 4 is a flow chart of a routine executed on the workstation shown in FIG. 1, for conditioning the measured spectrum to suppress a peak caused by a solvent in a sample for which the measured spectrum is produced.

Referring to FIG. 4, a routine for filtering the selected region is shown generally at 66 and involves a first block 92 that causes the workstation 16 to apply a notch filter to the selected region to suppress a peak in that region. A set of initial notch filter parameters specifying the attenuation, width and position of the notch filter is used.

Applying a notch filter may further involve producing an adjusted set of notch filter parameters and applying a notch filter employing the adjusted set of notch filter parameters to the selected region. The set of notch filter parameters may be adjusted to produce an adjusted set of notch filter parameters that may be applied to the notch filter to filter the selected region until a sum of the absolute values of areas defined by peaks above and below a baseline of the initial spectrum is minimized. In this embodiment this is done by block 94 which causes the workstation to adjust the set of initial notch filter parameters and re-apply the notch filter until the sum of the absolute values of the areas of the spectrum in the selected region, is minimized. One quick way of doing this and minimizing the number of iterations of application of the notch filter is to employ numerical methods to successive values produced. For example, in this embodiment, using the Varian VNMR software, the parameter "sslsfrq" specifies a notch filter value that affects the minimization of the sum of the areas above and below the baseline. Brent's method, as described in Brent, R. P. 1973, Algorithms for Minimization without Derivatives (Englewood Cliffs, N.J.: Prentice-Hall), Chapter 5, [1], for example may be used to find an optimum value for "sslsfrq".

Referring back to FIG. 2, after filtering the selected region block 68 is invoked to automatically phase the entire spectrum and make the peaks as symmetrical as possible. This may be done iteratively, for example, by adjusting the real and imaginary components of the transformed FID data until the resulting spectrum has positive, well defined peaks. In this embodiment, employing the Varian VNMR software, this is achieved by invoking block 84 which calls the "aph0" command of the VNMR software. Some versions of the VNMR software may require more than one successive execution of the aph0 command.

After automatic phasing parameters of the spectrum have been produced, optionally, a baseline correction block 69 may be executed to flatten out the baseline of the spectrum. Alternatively, baseline correction may be performed later. Baseline correction may be done by analysing the spectrum to determine areas with peaks and areas devoid of peaks and setting areas devoid of peaks to have a common intensity value such as zero, for example. An example of baseline correction available at www.acdlabs.com/publish/nmr_ar. html published by Advanced Chemistry Development Inc. of Toronto, Ontario, Canada.

Block 56 then causes the workstation 16 to save parameters produced by the various sub-processes of block 54 in association with the FID data and text, if desired. With the Varian VNMR software this may be achieved using the 'svf($savefid)' command.

Block 58 then directs the workstation 16 to produce a trace file comprised of (x,y) values representing intensity versus frequency, by performing a Fourier Transform on the FID data, using the parameters produced as described above and associated with FID data. The trace file is then transferred or transmitted to the spectrum analysis apparatus 14 or is stored for later transfer to that apparatus.

Spectrum Analysis Apparatus

In the embodiment shown, the spectrum analysis apparatus (SAA) 14 is a separate component and includes a Linux workstation configured to receive the trace file representing the measured spectrum, from the spectrum producing apparatus 12. The spectrum analysis apparatus 14 is configured to receive and execute instructions embodied in computer readable codes to carry out a process for identifying compounds in a sample according to an embodiment of another aspect of the invention. The codes may be provided to the spectrum analysis apparatus through any of the media described above including the CD-ROM 26, Floppy disk 28, internet 30, extranet, intranet, electrical 32, RF 34, and optical 36 media and/or any other media capable of providing codes to the spectrum analysis apparatus.

It will be appreciated that the workstation 16 may alternatively be configured with both the codes to effect the process for producing a measured spectrum shown in FIG. 2 and the codes to effect the process for identifying compounds, or either of these. It is desirable however, to execute the process for identifying compounds at a computer other than the workstation 16, to enable the process for identifying compounds to be executed while another sample is being subjected to the NMR process, for example.

Process for Identifying Compounds

Figure 5:
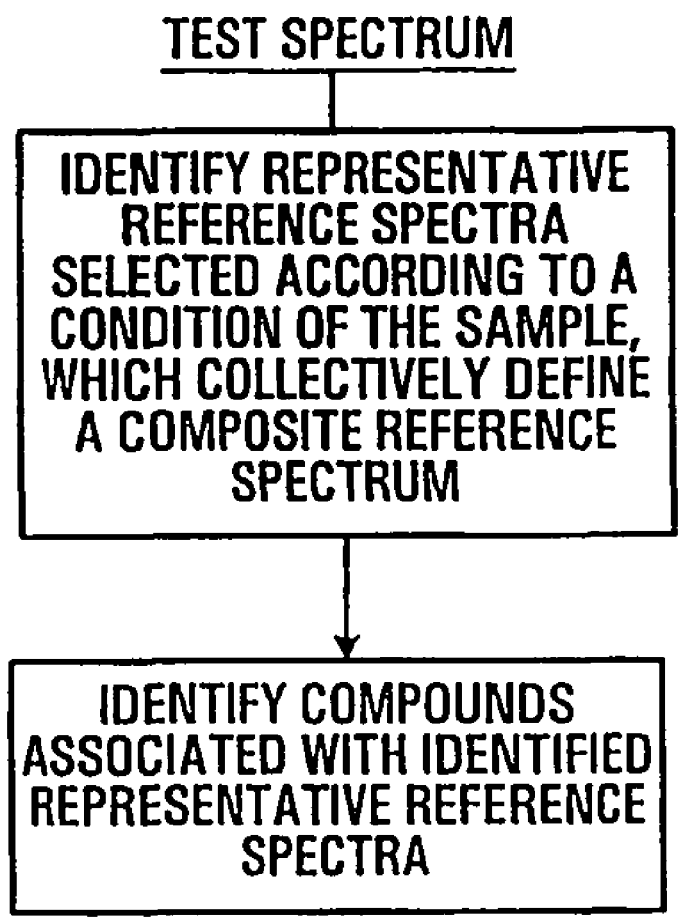
FIG. 5 is a flow chart of a process for identifying compounds executed by a spectrum analysis apparatus shown in FIG. 1.

Referring to FIG. 5, generally, the process for identifying compounds involves identifying representative reference spectra from a set of reference spectra associated with detectable compounds and selected according to a condition of the sample, which collectively define a composite reference spectrum having features matching a set of features in a test spectrum produced from the sample. Once the representative reference spectra have been identified, compounds with which they are associated may be identified.

The compounds associated with respective reference spectra of the identified set are the compounds that may be expected to be present in the sample. Quantities of the compounds may be determined from the intensities of certain representative peaks in the test spectrum which are associated with the compounds, relative to the intensity of a peak associated with the chemical shift calibration standard compound which is unaffected by the condition of the sample. A condition may be the pH of the sample, for example, and an accurate measurement of pH can be obtained from the test spectrum. Thus, given a test spectrum of a sample and given a set of reference spectra, the process can identify and quantify compounds present in the sample. Alternatively, the condition may be temperature, osmality, salt concentration, chemical composition, or solvent, for example.

Reference Spectra

Figure 6:
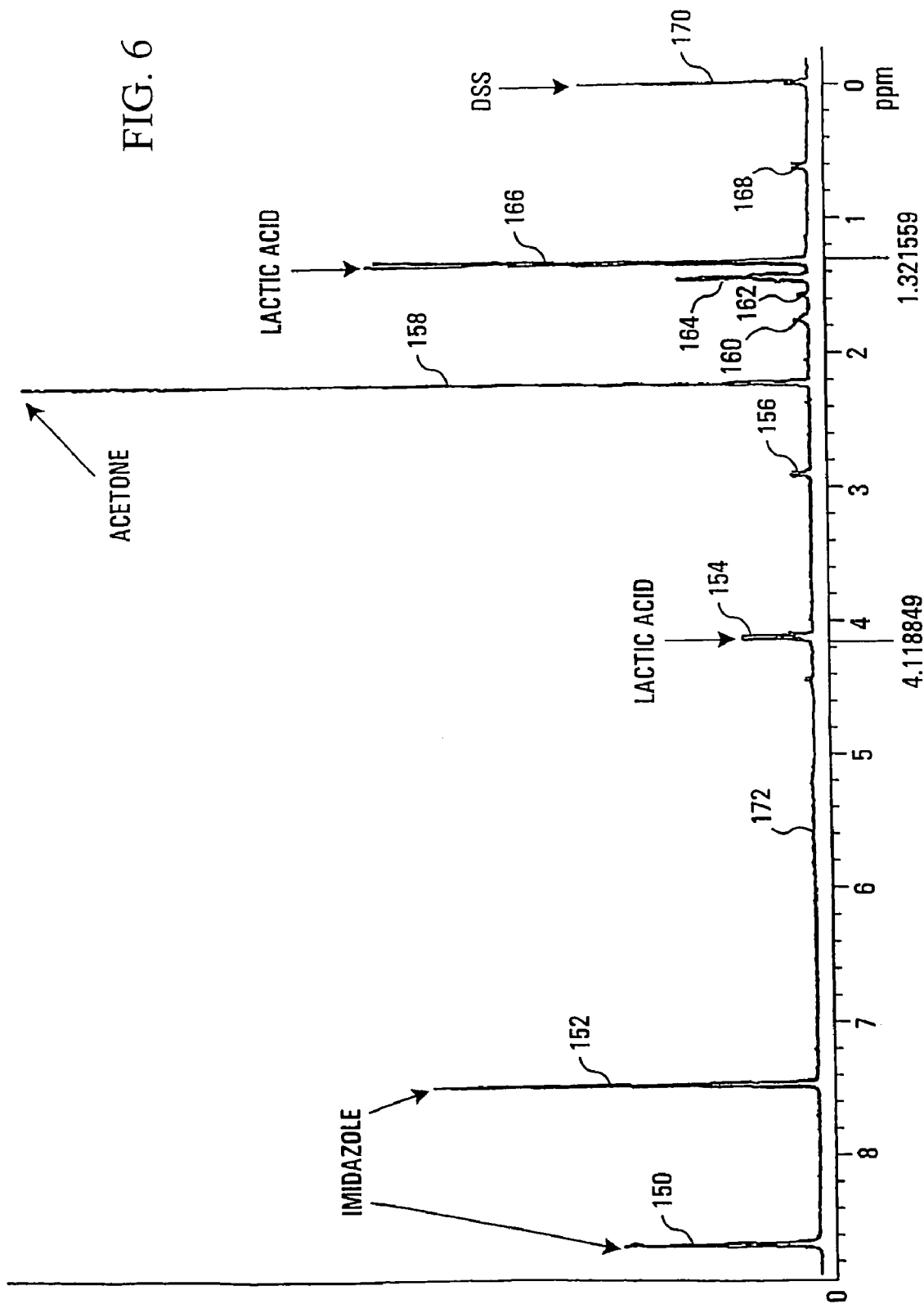
FIG. 6 is a pictorial representation of a reference spectrum associated with lactic acid at pH of 5.10.

Before the process for identifying compounds can be carried out, a set of reference spectra for compounds to be detected in the sample must be made available to the SAA 14. This can be done by storing data relating to reference spectra associated with respective compounds and allowing the SAA 14 access to the data. An exemplary reference spectrum for a given compound may initially be represented in the form of intensity versus frequency (x,y) values, which may be represented graphically. A reference spectrum for lactic acid is shown in FIG. 6, for example. It will be appreciated that such a spectrum may have a plurality of peaks and/or clusters of peaks 150, 152, 154, 156, 158, 160, 162, 164, 166, 168, 170 superimposed upon a featureless background, such as noise 172. The resolution along the x axis is dependent upon the frequency of the Magnet used in the Nuclear Magnetic Resonance Process employed to acquire the sample. The peaks that are associated with lactic acid are found in first and second clusters 166 and 154. These clusters are centered at 1.322 ppm and 4.119 ppm respectively. The first cluster is comprised of two peaks and the second cluster 154 is comprised of four peaks.

A reference spectrum of the type shown in FIG. 6 can be represented in various formats including mathematical representations such as Lorentzian equations which may specify peaks associated with the compound the spectrum is intended to represent. Such equations have the form:

$$f(x) = \frac{aw^2}{w^2 + 4(x-c)^2}$$

where:
  a represents amplitude of the peak
  w represents width of the peak; and
  c represents the center of the peak Thus, for example, the two peaks associated with the cluster centered on 1.322 ppm may be specified by two sets of Lorentzian line shape parameters a, w and c.

The Lorentzian line shape parameters for each peak associated with a given compound may be stored in a base reference spectrum record embodied in an XML file as shown in FIGS. 7A and 7B, for example. Such a file may have fields 200, 202 and 204, for example, for storing compound information, experiment information and cluster/peak information respectively. The compound information field may include sub-fields for storing the name of the compound with which the record is associated, and the molecular weight of the compound, for example. The experiment field may have sub-fields for storing information about the experiment, such as conditions under which the peak information about the compound was collected. This may include the pH of the solution that was analyzed, the temperature of the solution, the calibration reference compound ratio, the concentration of the compound in the solution, a timestamp, a sourcefile name, the frequency of the magnet used in the NMR process, and the spectral width of the entire spectrum, for example. The cluster/peak information fields may include separate fields 206 and 208 for each cluster (166 and 154 in FIG. 6).

Each cluster field 206 and 208 may include sub fields 210, 212, 214, 216 and 218 for representing information relating to the proton number of the cluster, the quantification of the cluster, the Lorentzian line width adjustment of the cluster and first and second peak subfields respectively. The first and second peak subfields may include fields 220, 222, and 224 for representing offset center information, height information and proton ratio information relating to a respective peak in the cluster, respectively.

Effectively, the Lorentzian line shape parameters (a) and (c) for each peak may be stored in the height and offset center fields 222 and 220 respectively and each peak in a given cluster is considered to have the same width (w) which is specified by the contents of the Lorentzian line width adjust field 214 associated with the cluster.

Figure 8:
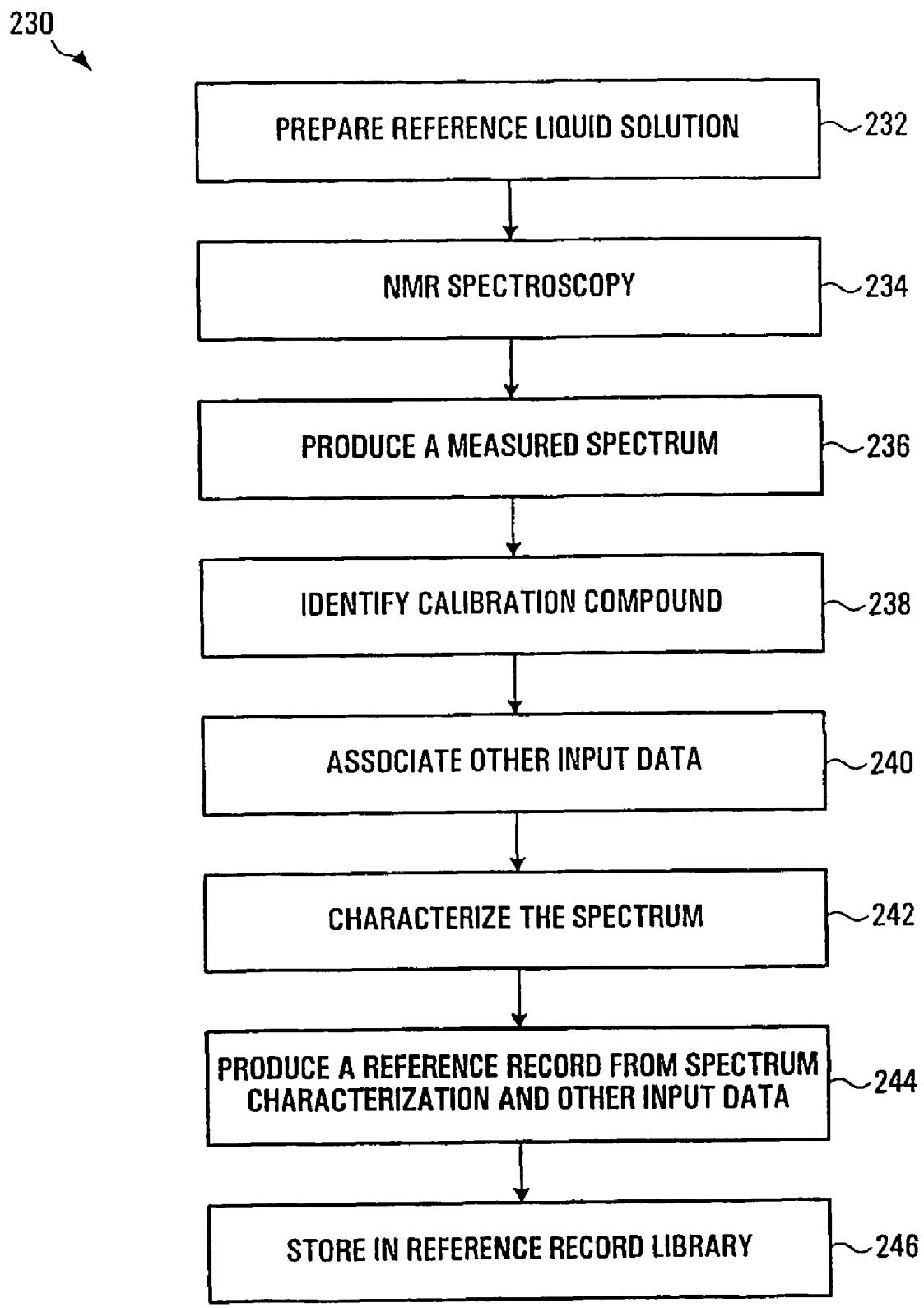
FIG. 8 is a flow chart of a process by which base reference spectrum records such as shown in FIGS. 7A and 7B may be produced.

Referring to FIG. 8, a process by which base reference spectrum records may be produced is shown generally at 230. The process begins with block 232 representing the preparation of a liquid solution containing a reference compound such as lactic acid, a calibration compound such as DSS and a condition indicator compound such as Imidazole. The liquid solution is prepared to a carefully calibrated concentration of the calibration compound at a carefully controlled temperature and pH. This step is carried out in a laboratory, by a human or by a mechanized process, for example.

Once the liquid solution containing the reference compound has been produced, as shown in block 234, it is subjected to the NMR process carried out by the apparatus 12 shown in FIG. 1 to produce FID data.

At block 236, the apparatus 12 subjects the FID data produced by the NMR process to the process shown in FIG. 2, to produce a measured reference spectrum.

Figure 9:
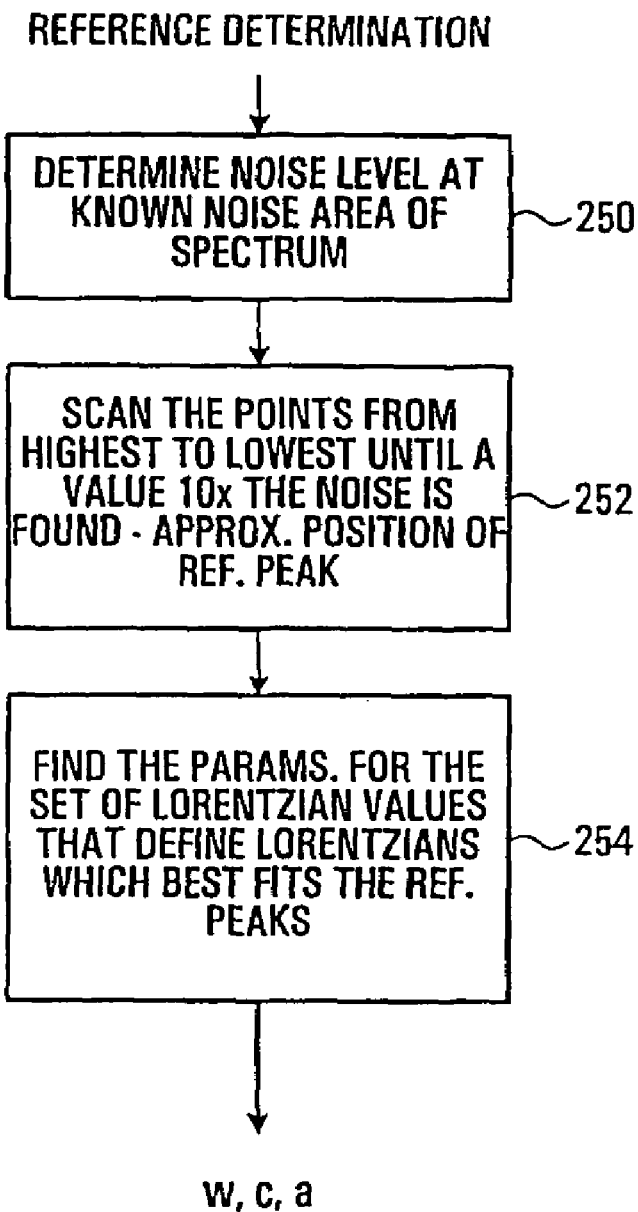
FIG. 9 is a process executed by the spectrum analysis apparatus shown in FIG. 1 to identify a peak associated with a calibration compound in a test spectrum.

Having obtained a measured reference spectrum, a process as shown in block 238 is initiated to identify the calibration compound and obtain calibration parameters. This process is shown in greater detail at 238 in FIG. 9. Referring to FIG. 9, the codes direct the SAA 14 to derive from the measured reference spectrum a characterization of the calibration compound contained in the sample. This involves identifying a position of a peak of the measured reference spectrum that meets a set of criteria that associate the peak with the calibration compound and further involves producing parameters for a mathematical model of the peak, that best represents the peak. Thus, in this embodiment the characterization is a list of Lorentzian line shape parameters (w, c and a) representing width, peak position and center amplitude respectively of a Lorentzian curve that best describes a feature, that is, a peak, of the measured reference spectrum, that is associated with the calibration compound. It will be appreciated that other characterizations could be used, such as those produced by peak picking, linear least squares fitting, the Levenberg-Marquardt method, or a combination of these methods.

To find a peak associated with the calibration compound and to produce a list of Lorentzian line shape parameters that characterize it, the SAA 14 is programmed with codes that include a first block 250 that directs the SAA 14 to determine a noise level at a pre-defined area of the measured reference spectrum. In this embodiment, it is known that an area on the x-axis (frequency) corresponding to positions 64,000 and 65,000 for example can be expected to be void of peaks and contain only noise. The standard deviation of the y-value (signal intensity) over this region of the measured reference spectrum is representative of the noise level of the entire spectrum and provides a measure of the noise level.

Next block 252 directs the SAA 14 to scan the measured reference spectrum in the negative x-direction beginning at the higher order end of the spectrum, to find a y-value that meets a certain criterion. For example, the criterion may be that the y-value must exceed the noise level by a pre-determined amount, such as a factor of 10, at the top of a peak. A y-value meeting this criterion is assumed to be associated with an x-value that represents the position of a peak associated with the calibration compound.

Block 254 then directs the SAA 14 to employ the x-value representing the approximate position of the calibration peak in the test spectrum in a fitting algorithm that fits a curve to the calibration peak and specifies width, height and position values. For example a Lorentzian line shape-fitting algorithm may be employed to produce Lorentzian line shape parameters (a, w and c) that define a Lorentzian line shape that best matches the calibration peak.

Referring back to FIG. 8, having calculated Lorentzian line shape parameters that identify and characterize the calibration compound, block 240 is carried out to associate other input data with the measured reference spectrum. Other input data may include information associated with the name and experiment fields 200 and 202 and information such as the number of protons (proton number in XML file) for each cluster and the proton ratio for each peak, for example.

Next at block 242, the measured reference spectrum is characterized by employing the well-known Conjugate Gradient method to determine Lorentzian line shape parameters (a, w and c) for each peak or to determine sets of such parameters that define a mathematical model or models of peaks that best fits the important peaks of the measured reference spectrum.

At block 244, a base reference spectrum record of the type shown in FIGS. 7A and 7B is produced from the other input data and the characterization of the spectrum. At block 246, the base reference spectrum record is stored in a reference record library, which effectively includes a plurality of reference records for various different reference compounds. For example, the reference record library may include base reference spectrum records for: L-phenylalanine, L-Threonine, Glucose, Citric Acid, Creatinine, Dimethylamine, Glycine, Hippuric acid, L-alanine, L-Histidine, L-Lactic Acid, L-Lysine, L-Serine, Taurine, Trimethylamine, Trimethylamine-N-Oxide, Urea, L-Valine, and Acetone.

Reference records may include base reference records or derived reference records. Base reference spectrum records may be produced by empirical processes as described above. New records known as derived reference records may be produced by operating on data from base reference records, and represent derived reference spectra. Operating on data may include interpolation and/or performing mathematical operations, and/or using a lookup table, for example. Thus, for example, a limited set of base reference spectrum records can be produced, including a record representing the spectrum for lactic acid at a pH of 5.1, and a record for lactic acid at a pH of 5.45, for example. A derived reference record representing the spectrum of lactic acid in a solution having a pH of 5.28, for example, can then be produced by performing mathematical operations on the Lorentzian line shape parameters specified by the base records associated with solutions at pH 5.1 and pH 5.45 to interpolate values for a solution at a pH of 5.28. Thus, a derived set of reference records can be produced for solutions of any pH, within a reasonable range, when required, thereby avoiding a priori production of base reference records for every pH condition. As will be appreciated below, this feature may be exploited by determining the pH value of a sample under test and using the determined pH value to produce a set of derived reference records for use in identifying compounds present in the sample. In other words, reference records for use in the process for identifying and quantifying compounds are selected from existing base reference records or are "selected" by producing derived reference records, according to a condition of the sample. In this embodiment, the condition is pH.

Process for Identifying Compounds

After having produced a reference library of base reference spectrum records, the process of identifying and quantifying compounds in a test sample can be carried out.

Process for Identifying and Qualifying Compounds

Figure 10A:
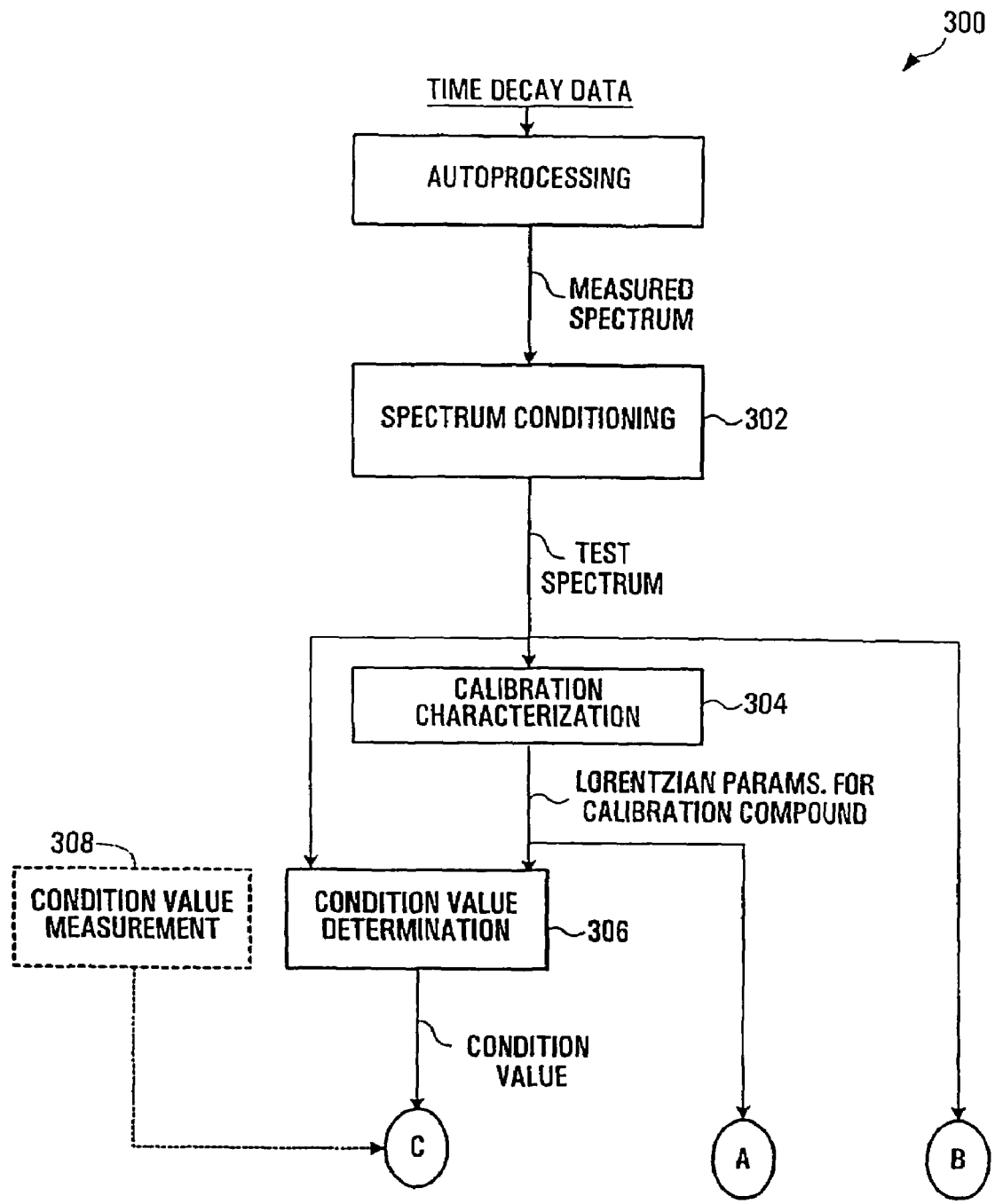
FIGS. 10A and 10B are a flow chart of the process for identifying compounds, shown in FIG. 5, in greater detail.
Figure 10B:
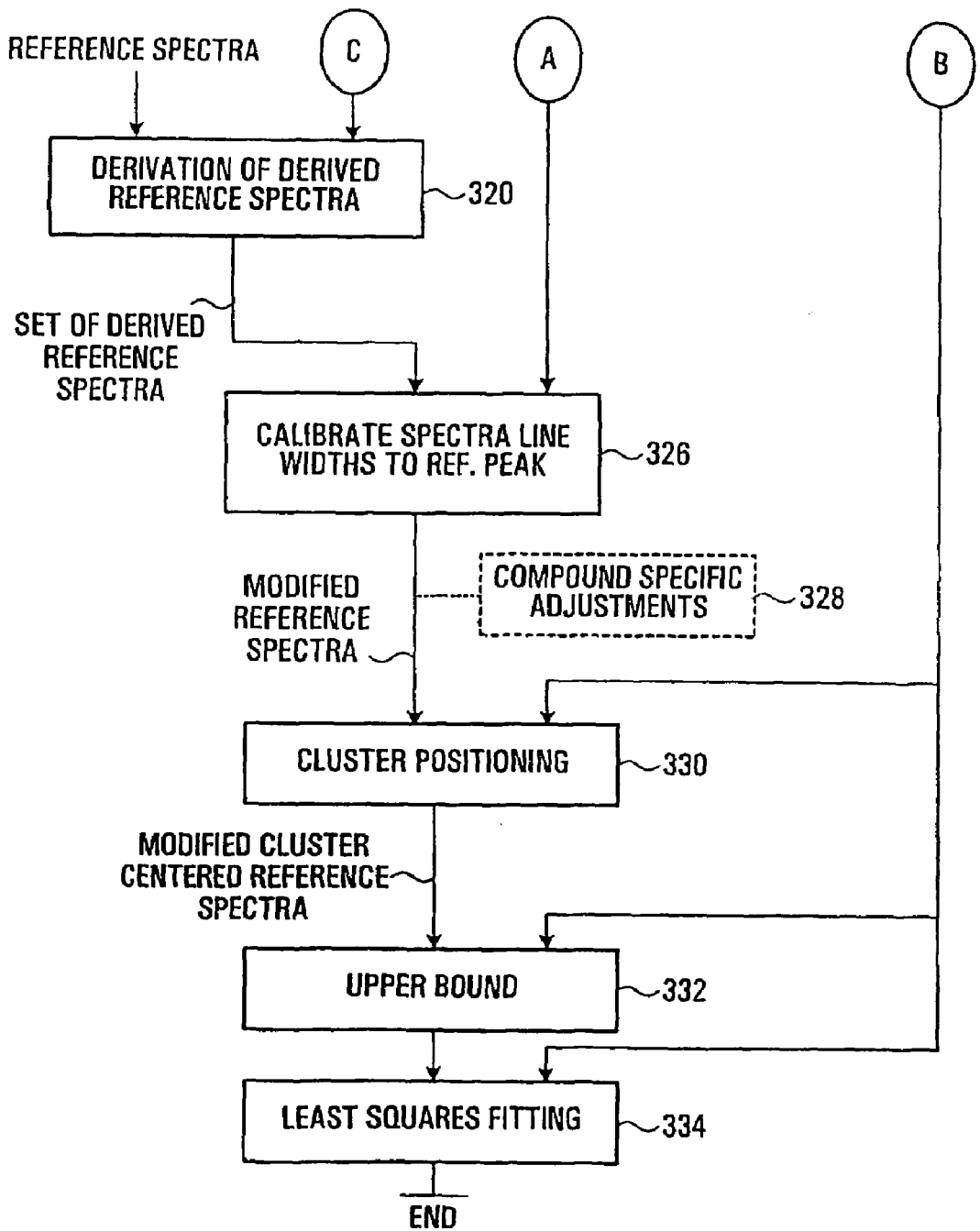

The process is shown generally at 300 in FIGS. 10A and 10B and begins with an optional first block of codes 302 that cause the SAA to perform a spectrum conditioning step.

Spectrum Conditioning

If the measured NMR spectrum of the test sample is of sufficient quality, it can be used directly in subsequent operations of the process disclosed herein. However, usually, the measured spectrum will not be of sufficient quality and will require further processing to condition it for later use. This further conditioning may involve baseline correction as described earlier, for example, to produce a conditioned spectrum.

Thus the following description will refer to a test spectrum, which may be the measured spectrum described above, if such measured spectrum is of sufficient quality or it may be a conditioned spectrum. A measured spectrum having a corrected baseline, for example, would be an example of a measured spectrum that would not need to be subjected to further processing to condition it. Usually however the process will involve producing a test spectrum from the measured spectrum.

Calibration Determination

After being provided with, or after producing, a test spectrum of the type described, the process involves block 304 to produce a characterization of a calibration compound in the sample or block 306 to determine a representation of a condition of the sample. These two functions can be done independently or the determination of the condition of the sample can be determined after first characterizing the calibration compound.

The process of characterizing the calibration compound generally involves identifying a peak associated with a calibration compound, in the test spectrum. This may involve identifying a peak meeting a set of criteria that associate the peak with the calibration compound. The peak associated with the calibration compound may be characterized by producing Lorentzian line shape parameters to represent the peak.

Block 304 relating to characterizing the calibration compound involves a call to the process shown in FIG. 9 to cause the SAA 14 to produce a set of Lorentzian values (a, w and c) which best represent the peak associated with the calibration compound in the test spectrum.

Condition Factor Determination

Optionally, as shown by block 308, a separate measuring device may be used to measure the selected condition of the test sample. In this embodiment, the measured condition is pH which may be measured by a separate pH meter to produce a pH condition value that may be supplied to the SAA as indicated at "C" in FIG. 10, for use in later functions of the process.

If the condition value has not already been obtained desirably the condition value can be derived from the test spectrum itself as shown at block 306. This is possible where the measured condition is pH because the identification of a peak associated with a pH indicator compound in a sample can be readily determined from the test spectrum and the Lorentzian line shape values that characterize the representation of the calibration compound in the test spectrum.

Figure 11:
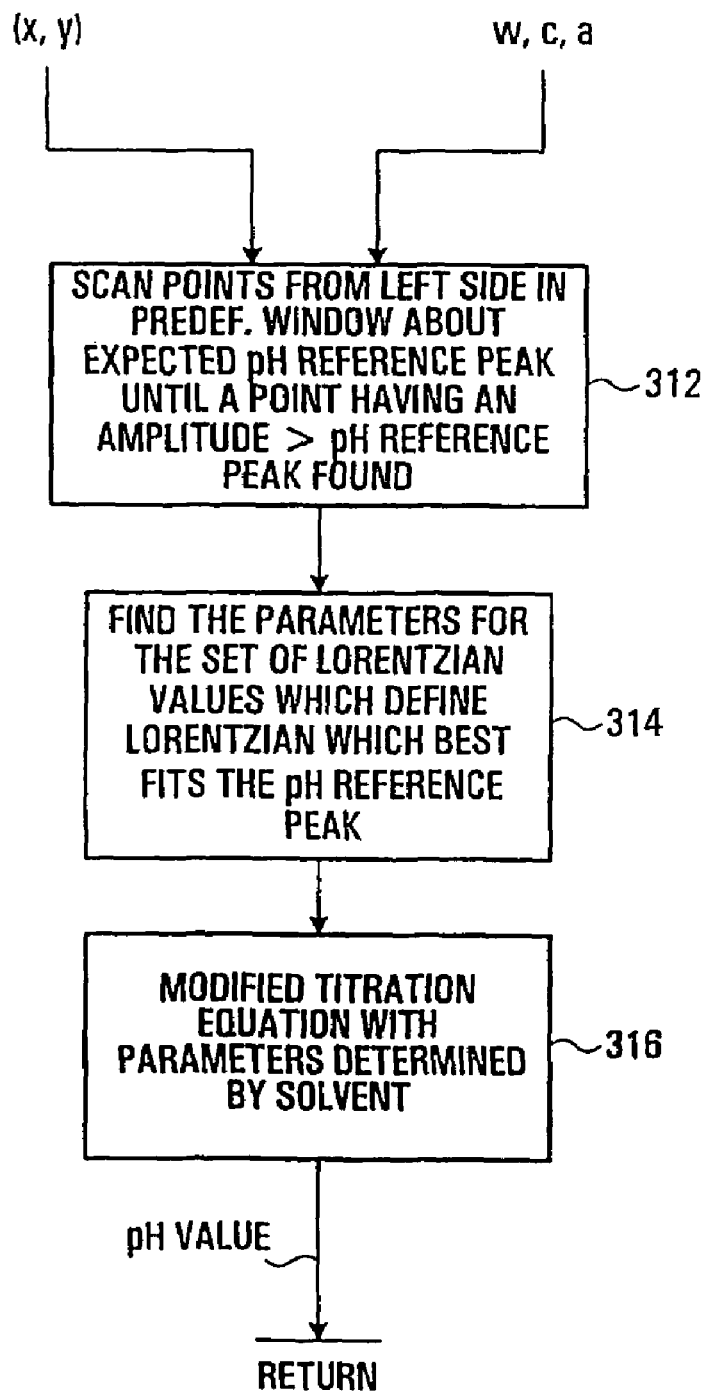
FIG. 11 is a flow chart of a process executed by the spectrum analysis apparatus for determining a pH value from the test spectrum.

Referring to FIG. 11, a process for determining a pH condition value from the test spectrum is shown generally at 310. Basically, the process involves identifying a position, height and width of a peak associated with a condition reference compound in the test spectrum and this may involve identifying a peak meeting a set of criteria that associate the peak with the condition reference compound. Once the peak is identified the measured condition value may be produced as a function of the peak position and parameters of the sample medium, the parameters being the parameters that define the calibration compound.

To achieve this, in this embodiment, the codes include a block 312 which directs the SAA 14 to employ the Lorentzian line shape parameter (c) associated with the calibration compound to locate a window in the test spectrum, where a peak associated with the pH indicator compound is expected to be. The window is then scanned along the x-axis (frequency) from left to right, for example, for a y-value (intensity) that is greater than the amplitude value specified by the Lorentzian line shape parameter (a).

When a y-value meeting the above criteria is found, block 314 causes the SAA 14 to execute a characterization algorithm to produce at least a center value (c) representing the center of the peak associated with the pH reference compound. For example a Lorentzian curve algorithm may be used to produce Lorentzian parameters a, w and c defining the peak associated with the pH reference compound.

Block 316 then directs the SAA 14 to execute a modified pH titration Equation as shown below, on the center value c and to use certain parameters of the sample solvent, in the equation, to produce a condition value representing pH of the sample:

$$\text{pH} = pK_A - \log\left[\frac{\delta_{obs} - \delta_A}{\delta_{HA} - \delta_{obs}}\right]$$

where:

$\delta_{obs}$ is the observed chemical shift (center c);

$\delta_A$ is the chemical shift of the conjugate base;

$\delta_{HA}$ is the chemical shift of the conjugate acid; and $pK_A$ is an association constant for the conjugate base.

Assume that no matter what method of determining pH is used, a pH value of 5.28 is obtained for the sample. Referring Back to FIG. 10B block 320 directs the SAA to receive the condition value either produced externally, such as by measurement or produced internally such as by using the test spectrum as described above, to produce a derived reference record representing a derived reference spectrum for use in later functions of the process. Separate derived reference records may be produced from corresponding base reference spectrum records associated with corresponding compounds expected to be in the sample. Thus, in effect a representation of a set of derived reference spectra may be produced from a set of reference spectra and the measured condition value. In general, a process for producing a representation of a spectrum for a hypothetical solution containing a compound, for use in determining the composition of a test sample, involves producing a position value for at least one peak of a reference spectrum as a function of the measured condition of the test sample and a property of the at least one peak in a base reference spectrum. The property may be a position of a peak, amplitude of the peak or width of the peak for example. In this embodiment, a derived reference record is used to represent a representation of a spectrum for the hypothetical solution.

Figure 12:
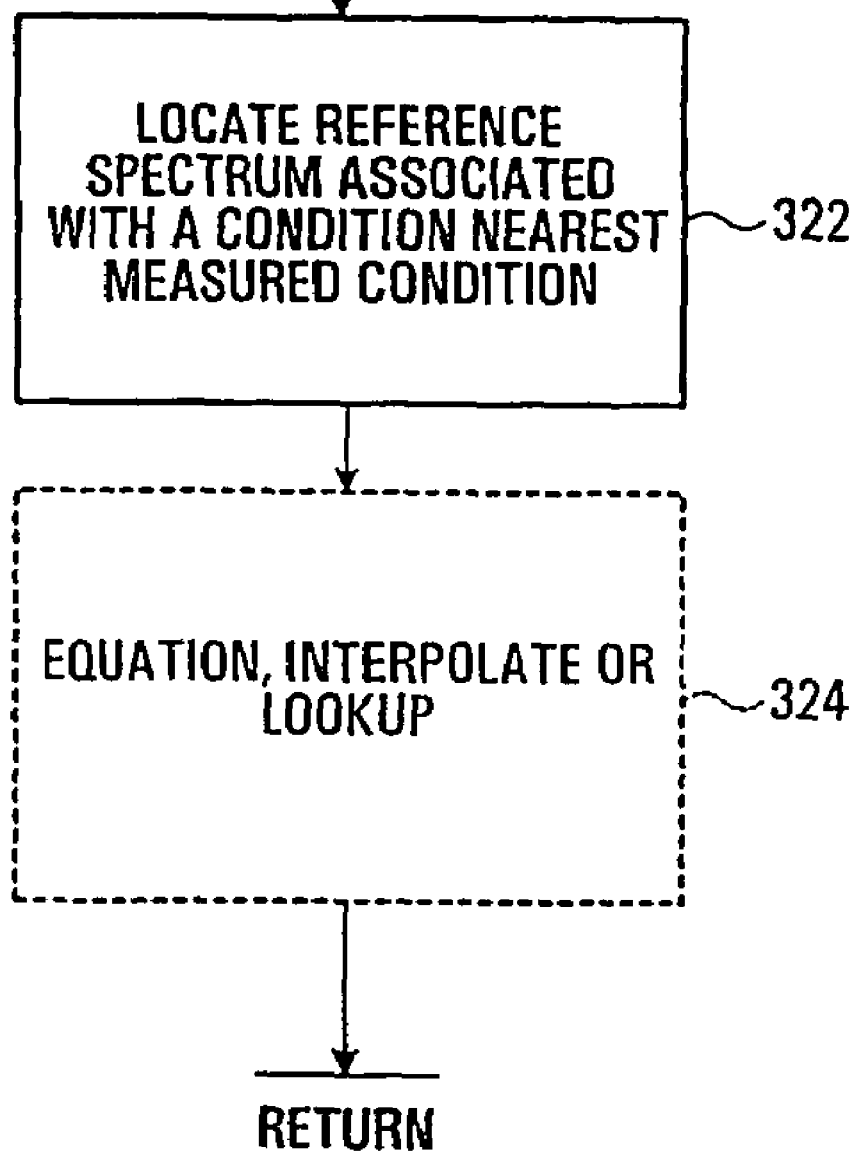
FIG. 12 is a flow chart of a process executed by the spectrum analysis apparatus for producing a derived reference spectrum.

Referring to FIG. 12, producing a derived reference record may involve accessing a pre-defined record specifying peaks in a reference spectrum and adjusting a position value in the record, the position value being the position value of the at least one peak. This may be done by block 322 which causes the SAA to identify a base reference spectrum record that is associated with a condition nearest to the measured condition of the sample and to use such reference spectrum as the derived reference spectrum.

Producing a position value for a peak may involve interpolating a position value from position values associated with base reference spectra associated with condition values above and below the measured condition value associated with the sample. For example, block 324 may be employed to cause the SAA 14 to produce a position value by calculating the position value as a function of pH of the sample and to effectively produce or interpolate a derived reference spectrum.

To interpolate a derived reference spectrum, assume that at block 322 a base reference record for lactic acid at a pH of 5.10 is located as being the base reference spectrum record for lactic acid that is nearest to the pH of the sample, 5.28. Such a record is shown in FIGS. 7A and 7B. Referring back to FIG. 12, block 324 may direct the SAA 14 to find another base reference spectrum record for lactic acid that is associated with a pH value greater than the pH of the sample. Assume that it locates a base reference spectrum record associated lactic acid at a pH of 5.45. A record of this type is shown in FIGS. 13A and 13B. On locating this second base reference spectrum record, block 324 directs the SAA 14 to create a new derived reference spectrum record for lactic acid at a pH of 5.28. To do this the SAA 14 is directed to make a copy of the base reference spectrum record associated with a pH of 5.45 and then to replace the frequency values for the center position of each cluster shown in that record, with interpolated values. A simple linear interpolation is used to find the value 1.3202 for the first cluster and the value 4.1149 for the second cluster. FIGS. 14A and 14B show the resulting derived reference spectrum record for a pH of 5.28, for lactic acid, produced using this method. Similarly, derived reference spectrum records are produced for each compound in the reference library to produce derived reference records for a pH of 5.28 for each compound represented in the library.

Alternatively, adjusting the position of a peak may involve locating a measured condition value dependent function in a base reference record, or pre-defined record, producing the position value from the function and associating the position value with the pre-defined record. Associating may involve storing the position value in the pre-defined record, for example. To effect this method of adjusting the position of a peak, a generic type of derived record may be kept, in which equations, effectively specifying the centerPPM values for the two clusters as a function of pH may be provided in the field associated with the centerPPM value for each cluster, as shown in FIGS. 15A and 15B. Then, whenever a pH value is found from a sample, a copy of the record can be made and the pH value may be used in the equations in the copied record to produce centerPPM values. These center PPM values can then be substituted for the respective equations that produced them, in the copied record, thereby producing a new derived record for use in later calculations.

Alternatively, producing a position value may involve producing the position value by addressing a lookup table of position values with the measured condition value of the sample. For example the position value of a peak may be adjusted by locating, in a pre-defined record, a link to a lookup table specifying peak positions for various condition values, retrieving the position value from the lookup table and associating the position value with the pre-defined record. To do this a second generic type of derived record may be kept, in which lookup table links, effectively specifying links to lookup tables (not shown) that return centerPPM values for input pH values may be provided in the field associated with the centerPPM value for each cluster, as shown in FIGS. 16A and 16B. Then, whenever a pH value is found from a sample, a copy of the record can be made and the pH value may be used to address the lookup tables associated with the links specified in the record to produce centerPPM values. These center PPM values can then be substituted for the respective links that produced them, in the copied record, thereby producing a new derived record for use in later calculations.

Referring back to FIG. 10B, after having produced a derived reference spectrum for each compound that is likely to be in the sample, block 326 causes the SAA 14 to calibrate the Lorentzian line width values for the derived reference spectrum relative to the test spectrum to provide for a better fit to the test spectrum. To do this, block 326 may direct the SAA 14 to calibrate to the (a, c and w) values associated with the calibration compound in the sample, the spectral linewidths of peaks associated with each of the reference compounds. In this embodiment block 326 may direct the SAA 14 to employ the contents of the Lorentzian width adjust field 214 of each derived reference spectrum record to produce respective absolute values representing actual linewidths relative to the calibration compound linewidth. These modified spectral line widths may be associated with respective peaks in the same cluster of each reference compound, by storing these modified spectral line widths in an internal data structure (not shown) that associates modified spectral information with derived reference records.

Still referring to FIG. 10B, optionally, compound specific adjustments as shown by block 328 may be made to the contents of the fields of the derived reference records, where it is known, for example that certain effects occur when certain reference compounds are present in the test sample. For example, the shift of peaks associated with citrate is affected by the presence or absence of certain divalent cations and therefore the process may include a compound-specific adjustment to compensate for shifts known to occur when the presence of such divalent cations is known. Other compound-specific adjustments may be made to compensate for shifts due to temperature, chemical interactions, dilution effect and other ligand effects.

Cluster Centering

Still referring to FIG. 10B the process may further involve a cluster centering step as shown at 330 for shifting the derived reference spectrum in frequency (x-direction) to better align it with the test spectrum. This may involve producing a cluster position indicator for a derived reference spectrum, which causes the positions of peaks in the derived reference spectrum to match corresponding peaks in the test spectrum. A cluster position indicator already associated with the derived reference spectrum may be used or a cluster position indicator that produces a match of the derived reference spectrum to the test spectrum to a defined degree may be derived from the cluster position indicator already associated with the derived reference spectrum. In the embodiment shown, producing a cluster center indicator is achieved by attempting to fit the cluster to the test spectrum. To do this, cluster center values around the cluster center value already associated with the derived reference spectrum are assigned to the derived reference spectrum and used to effectively shift the derived reference spectrum to the left and right of the current cluster center value. For example, cluster center values +/−0.001 ppm points are successively assigned to the derived reference spectrum to successively shift the center of the derived reference spectrum at successive points in a window extending −0.003 ppm to +0.003 ppm from the currently assigned cluster center. At each point, the derived reference spectrum is used in a Levenberg-Marquardt (LM) fitting algorithm that determines a correlation value for each position of the center of the derived reference spectrum in the window. The center position that causes the LM fitting algorithm to produce the best correlation value is then associated with the derived reference spectrum correlation value and is used in later calculations. Thus in effect, the derived reference spectrum is "wiggled" into alignment with the test spectrum. This wiggling is done independently for each cluster of peaks in the derived reference spectrum.

Upper Bound Concentration Estimates

Still referring to FIG. 10B, in this embodiment, the process for identifying and quantifying further involves block 332 which causes the SAA 14 to produce an upper bound estimate of a quantity of a compound associated with a derived reference spectrum, for use in a least squares algorithm later in the process. In general, producing an upper bound concentration estimate comprises selecting as the upper bound concentration estimate, a lowest concentration value selected from a plurality of concentration values calculated from respective peaks in the test spectrum. This may involve finding the height of a peak in the test spectrum that corresponds to a peak in the reference spectrum and determining a concentration value for the peak as a function of its height. Prior to determining a concentration estimate for a peak, the process may involve predicting whether the height of a peak in the test spectrum is greater than a threshold level and deciding not to determine a concentration for the peak when the height is less than the threshold level.

Figure 17:
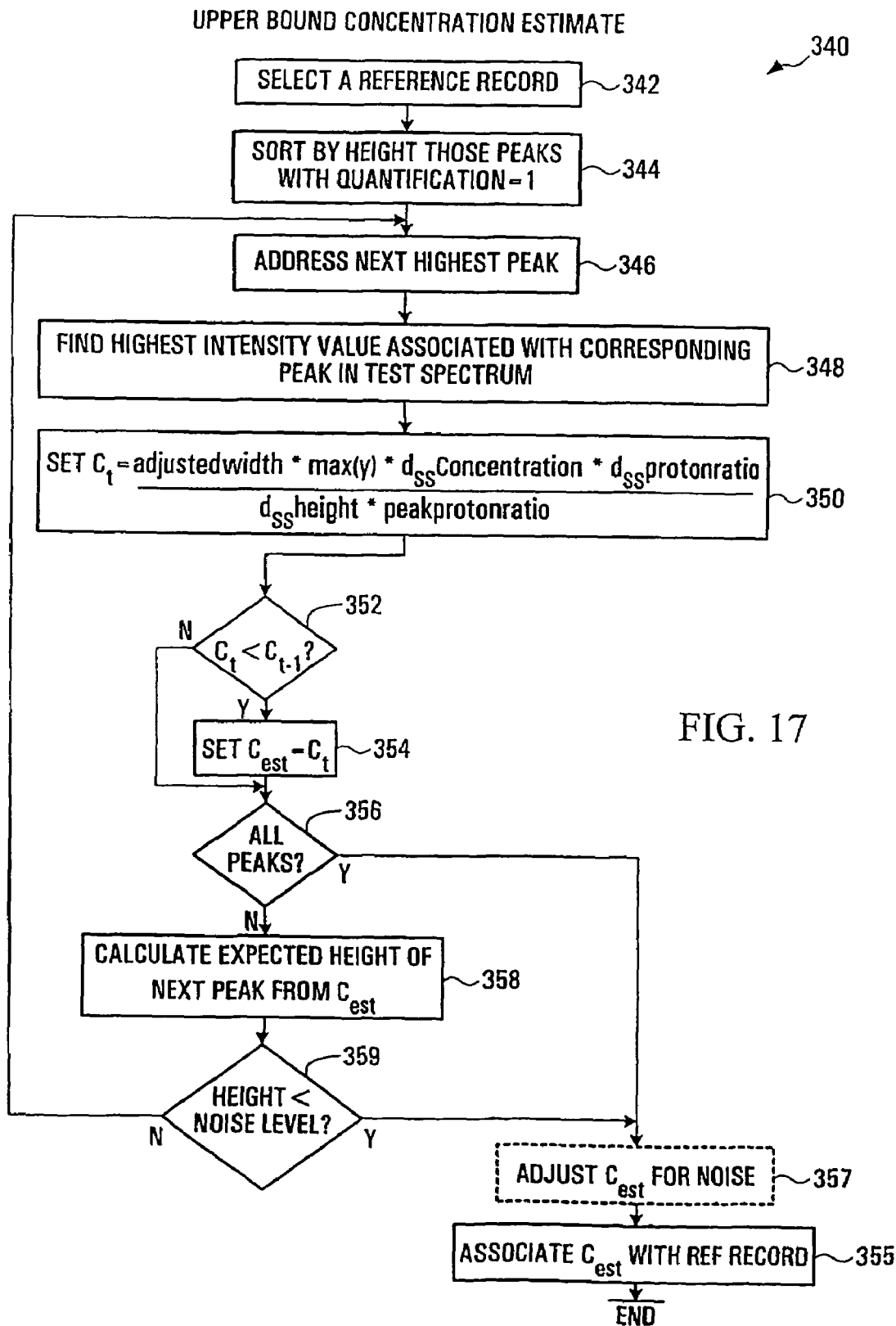
FIG. 17 is a flow chart of a process for determining an upper bound concentration estimate.

Referring to FIG. 17 a process implemented by program codes operating on the SAA 14 of FIG. 1, for producing an upper bound concentration estimate is shown generally at 340. A first block 342 causes the SAA 14 to select a reference record. Next block 344 causes the SAA 14 to sort by height those peaks in the reference record that have a quantification value equal to 1. This causes the process to consider only those peaks that provide reliable concentration estimates. Next, block 346 directs the SAA to address the (next) highest peak of those that have just been sorted at block 344. Reference is made to the "next" high peak because the peaks are considered in succession. On the first pass through the process however, the highest peak found in the sort is the first peak addressed.

Next block 348 causes the SAA 14 to use the position of the currently addressed peak in the reference spectrum to locate a corresponding peak in the test spectrum. This may involve looking for a peak in a window positioned at a corresponding position in the test spectrum. On finding such a peak, the maximum intensity value (max(y)) associated with that peak is found.

At block 350, the SAA 14 is directed to calculate a concentration value as a function of the max (y) value, using the following equation:

$$Ct = \frac{adjustedwidth * \max(y) * dssconcentration * dssprotonratio}{Dssheight * peakprotonratio} \quad (17)$$

Where:

Ct is the concentration value for the peak adjustedwidth is the width of the peak as determined from the variable w calculated as shown in FIG. 9 and the Lorentzian width adjust value stored in the reference record max(y) is the maximum y-value associated with the corresponding peak in the test spectrum dssconcentration is the concentration of DSS in the sample 0.5 mM, for example dssprotonratio is the DSS proton ratio (9, for example)

Dssheight is the DSS height value a, calculated as shown in FIG. 9

Peakprotonratio is the proton ratio of the peak, as indicated in the reference record.

At block 352 SAA 14 is directed to determine whether the currently calculated concentration value is less than the previously calculated value. If so, then block 354 causes the SAA 14 to set a preliminary upper bound concentration value to the current concentration value. If at block 352, the currently calculated concentration value is not less than the previously calculated value, the preliminary upper bound concentration estimate value remains at its former value. The effect of blocks 352 and 354 is to cause the preliminary upper bound concentration estimate to be set to the lowest concentration value calculated for any of the peaks.

Once the preliminary value has been determined from the current pass, block 356 directs the SAA 14 to determine whether all peaks with quantification values of 1 have been considered. If so, the SAA 14 is directed to optional block 357 in FIG. 17. If not, the SAA 14 is directed to block 358 which causes the SAA to calculate the expected height of the next peak associated with the compound, in the test spectrum. To do this equation 17 above is solved for max(y) using the current preliminary concentration estimate, and the Lorentzian width adjust value, and the peak proton ratio of the next highest peak from the list of sorted peaks. Then, block 359 in FIG. 17 causes the SAA 14 to determine whether the max(y) value so found is less than the noise level of the spectrum. (noise level was calculated at block 250 in FIG. 9). If not, then the next peak is worth considering and the SAA 14 is directed to resume processing at block 346 to address the next highest peak in the sorted list.

If the estimated height of the next highest peak found at block 358 is less than the noise level of the spectrum, the SAA 14 is directed to an optional block 357 which increases the amplitude of the preliminary concentration estimate value by the amplitude of the noise in the test spectrum to produce a true estimate of the upper bound concentration limit for the compound. This is useful where concentration values are very low.

Then, finally, block 355 directs the SAA 14 to associate the true upper bound concentration estimate with the reference record, such as by storing the upper bound concentration estimate value in a field (not shown) of the record, or in a field of a data structure maintained in the SAA 14 to create such associations.

Least Squares Fitting

Referring back to FIG. 10B, the process for identifying and quantifying compounds involves a block 334 which causes the SAA 14 to perform a least squares fitting algorithm using all of the derived reference records and the test spectrum to produce scaling values for each peak in each reference spectrum such that when all peaks from all reference spectra are summed they produce a composite spectrum that best matches the test spectrum.

Figure 18:
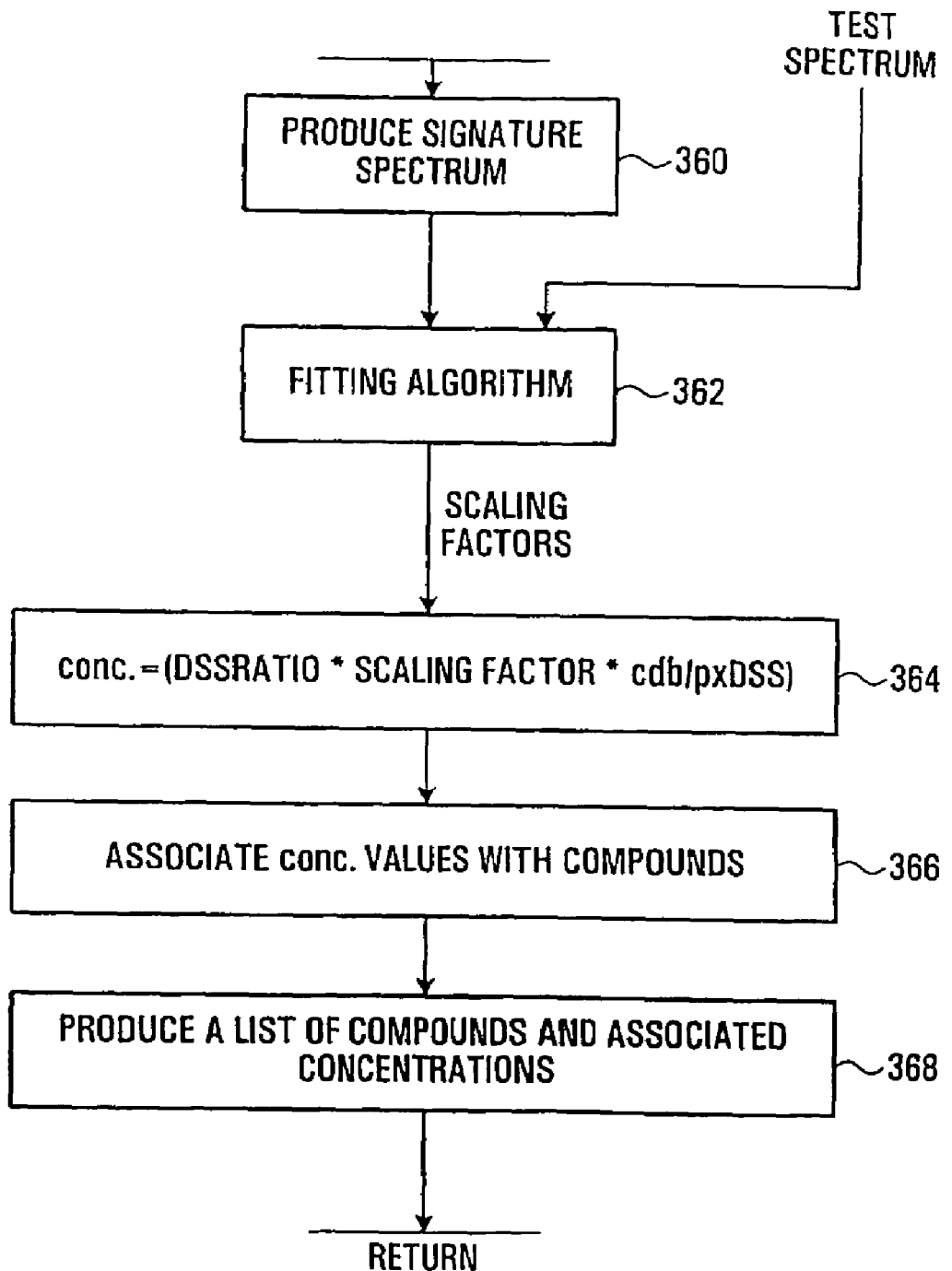
FIG. 18 is a flow chart of a least squares fitting routine referenced by FIG. 10B.

Referring to FIG. 18, the least squares fitting routine includes a first block 360 which causes the SAA 14 to produce "signature" spectra comprised of (x,y) pairs that define a composite spectrum representative of the sum of all Lorentzians in a given derived reference record. A separate signature spectrum is produced for each derived reference record. Thus a separate (x,y) array is produced for each derived reference record.

Block 362 then provides each signature spectrum, upper bound concentrations and the (x,y) array representing the test spectrum to a Linear Least Squares fitting routine, which in this embodiment is LS SOL licensed from Stanford University of California, USA. This routine returns scaling factors for each peak in each applicable reference record, such that when the scaled Lorentzian models specified in all applicable reference records are summed together to make a composite spectrum, the composite spectrum has features matching features in the test spectrum produced from the sample. These scaling factors thus identify representative reference spectra from a set of reference spectra associated with detectable compounds and selected according to the measured condition of the sample.

In this embodiment, an indication of compounds associated with reference spectra having peaks that when scaled by the scaling factors have a height greater than a threshold may be produced. This may involve producing a list of compounds, for example. Thus, scaled peaks having a height less than the threshold may indicate that the presence of the associated compound in the sample is questionable and therefore such compound should not be listed as being present in the sample.

Block 364 then causes the SAA 14 to employ these scaling factors in the following equation to quantify each compound by producing concentration values for each compound represented by a reference record:

$$\text{Conc.} = (DSSRatio * scalingFactor * cdb)/pxDSS$$

Where:
Conc.: concentration of the given compound in the sample
DSSRatio: the DSSRatio entry for the given compound (see field 202 in FIG. 7A)
scalingFactor: the scaling factor of the highest peak in the given compound (from least squares fitting)
cdb: the concentration of the given database entry (see field 202 in FIG. 7A)
pxDSS: the pixel height of DSS in the spectrum (the value a as determined by the process shown in FIG. 9)

Block 366 then causes the SAA 14 to associate these concentration values with the compounds associated with the derived reference records.

Block 368 then causes the SAA 14 to produce a list or indication of compounds in the sample, along with their associated concentration values. This list may be printed and/or displayed on a monitor, for example. Concentration values may be expressed in moles, mmol/L, g/L or moles/ mole, for example and absolute quantities may be obtained by a simple equation converting concentration to absolute quantity values, in moles, for example.

While specific embodiments of the invention have been described and illustrated, such embodiments should be considered illustrative of the invention only and not as limiting the invention as construed in accordance with the accompanying claims.

What is claimed is:

1. A computer-implemented process for producing a representation of a reference spectrum for a hypothetical solution having a first pH condition, for use in determining the composition of a test sample, the process comprising:
    producing a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition; and
    storing said reference spectrum including said position value in memory for use in a process for determining the composition of the test sample.

2. A computer-implemented process for producing a representation of a reference spectrum for a hypothetical solution having a first pH condition, for use in determining the composition of a test sample, the process comprising:
    producing a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition, wherein producing a position value comprises interpolating said position value from position values associated with base reference spectra associated with a pH condition nearest to said measured pH condition; and
    storing said reference spectrum including said position value in memory for use in a process for determining the composition of the test sample.

3. A computer-implemented process for producing a representation of a reference spectrum for a hypothetical solution having a first pH condition, for use in determining the composition of a test sample, the process comprising:
    producing a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition, wherein producing a position value comprises producing said position value by addressing a lookup table of position values with a measured pH condition value representing said measured pH condition of said test sample; and
    storing said reference spectrum including said position value in memory for use in a process for determining the composition of the test sample.

4. The computer-implemented process of claim 3 wherein said lookup table specifies peak positions for various pH conditions and wherein addressing said lookup table comprises:
    accessing a pre-defined record comprising a link to said lookup table;

retrieving said position value from said lookup table; and associating said position value with said pre-defined record.

5. The computer-implemented process of claim 4 wherein associating comprises storing said position value in said predefined record.

6. A computer-implemented process for producing a representation of a reference spectrum for a hypothetical solution having a first pH condition, for use in determining the composition of a test sample, the process comprising:
producing a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition, the process further comprising accessing a pre-defined record specifying peaks in said reference spectrum and adjusting a position value in said pre-defined record, said position value in said pre-defined record being said position value of said at least one peak, wherein adjusting comprises locating a pH condition value dependent function in said pre-defined record, producing said position value from said pH condition value dependent function and associating said position value with said pre-defined record; and
storing said reference spectrum including said position value in memory for use in a process for determining the composition of the test sample.

7. The computer-implemented process of claim 6 wherein associating comprises storing said position value in said pre-defined record.

8. A computer-readable medium encoded with computer readable instructions for causing a processor circuit to produce a representation of a reference spectrum for a hypothetical solution having a first pH condition, for use in determining the composition of a test sample, the instructions comprising:
a set of codes for directing the processor circuit to produce a position value for at least one peak of the reference spectrum in response to a measured pH condition of the test sample, and a property of at least one peak in a base reference spectrum for the hypothetical solution; the base reference spectrum being associated with a pH condition of the hypothetical solution that is different from said measured pH condition, wherein the set of codes further comprise codes that direct the processor circuit to interpolate said position value from position values associated with base reference spectra associated with a pH condition nearest to said measured pH condition and a set of codes for directing the processor circuit to cause said reference spectrum including said position value to be stored in memory for use in a process for determining the composition of the test sample.

9. An apparatus for producing a representation of a spectrum for a hypothetical solution having a first pH condition, for use in determining the composition of a test sample, the apparatus comprising:
a processor circuit programmed to produce a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition, wherein the apparatus is further adapted to interpolate said position value from position values associated with base reference spectra associated with a pH condition nearest to said measured pH condition and store said reference spectrum including said position value in memory for use in a process for determining the composition of the test sample.

10. An apparatus for producing a representation of a spectrum for a hypothetical solution having a first pH condition, for use in determining the composition of a test sample, the apparatus comprising:
means for receiving a measured pH condition value representing a pH condition of the test sample;
means for receiving a representation of a position value of at least one peak in a base reference spectrum for the hypothetical solution; and
means for producing a position value for at least one peak of a reference spectrum in response to said measured pH condition value of the test sample, and the position value of said at least one peak in said base reference spectrum, the base reference spectrum being associated with a pH condition value of the hypothetical solution that is different from said measured pH condition value, wherein said producing means is further adapted to interpolate said position value from position values associated with base reference spectra associated with a pH condition value nearest to said measured pH condition value and store said reference spectrum including said position value in memory for use in a process for determining the composition of the test sample.

11. A computer-readable medium encoded with computer readable instructions for causing a processor circuit to produce a representation of a reference spectrum for a reference hypothetical solution having a first pH condition, for use in determining the composition of a test sample, the instructions comprising:
a set of codes adapted to direct the processor circuit to:
produce a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition,
wherein said set of codes is further adapted to direct the processor circuit to produce a position value by addressing a lookup table of position values with a measured pH condition value representing said measured pH condition of said test sample; and
wherein said set of codes is further adapted to direct the processor circuit to store said reference spectrum including said position value in memory for use in a process for determining the composition of the test sample.

12. A computer-readable medium encoded with computer readable instructions for causing a processor circuit to produce a representation of a reference spectrum for a hypothetical solution having a first pH condition, for use in determining the composition of a test sample, the instructions comprising:
a set of codes adapted to direct the processor circuit to:
produce a position value for at least one peak of the reference spectrum in response to a measured pH condition of the test sample, and a property of at least one peak in a base reference spectrum for the hypothetical solution, the base reference spectrum being associated with a pH condition of the hypothetical solution that is different from said measured pH condition:
access a pre-defined record specifying peaks in said reference spectrum;
adjust a position value in said pre-defined record, said position value in said pre-defined record being said position value of said at least one peak, wherein the adjusting of the position value in said pre-defined record comprises:
locating a pH condition value dependent function in said pre-defined record;
producing said position value from said pH condition value dependent function;
associating said position value with said pre-defined record; and store said reference spectrum including said position value in memory for use in a process for determining the composition of the test sample.

13. An apparatus for producing a representation of a spectrum for a hypothetical solution having a first pH condition, for use in determining the composition of a test sample, the apparatus comprising:
a processor circuit programmed to produce:
a position value for at least one peak of a reference spectrum in response to a measured pH condition of the test sample, and a property of at least one peak in a base reference spectrum for the hypothetical solution, the base reference spectrum being associated with a pH condition of the hypothetical solution that is different from said measured pH condition, wherein said processor circuit is programmed to produce said position value by addressing a lookup table of position values with a measured pH condition value representing said measured pH condition of said test sample; and
store said reference spectrum including said position value in memory for use in a process for determining the composition of the test sample.

14. An apparatus for producing a representation of a spectrum for a hypothetical solution having a first pH condition, for use in determining the composition of a test sample, the apparatus comprising a processor circuit programmed to:
produce a position value for at least one peak of a reference spectrum in response to a measured pH condition of the test sample, and a property of at least one peak in a base reference spectrum for the hypothetical solution, the base reference spectrum being associated with a pH condition of the hypothetical solution that is different from said measured pH condition,
access a pre-defined record specifying peaks in said reference spectrum;
adjust a position value in said pre-defined record, said position value in said pre-defined record being said position value of said at least one peak,
adjust said position value by locating a pH condition value dependent function in said pre-defined record,
produce said position value from said pH condition value dependent function and to associate said position value with said pre-defined record; and
store said reference spectrum including said position value in memory for use in a process for determining the composition of the test sample.

* * * * *